United States Patent [19]

Austin

[11] Patent Number: 5,196,740
[45] Date of Patent: Mar. 23, 1993

[54] INTEGRATED CIRCUIT FOR ANALOGUE SYSTEM

[75] Inventor: Kenneth Austin, Northwich, England

[73] Assignee: Pilkington Micro-Electronics Limited, England

[21] Appl. No.: 679,483

[22] Filed: Apr. 2, 1991

[30] Foreign Application Priority Data

Apr. 3, 1990 [GB] United Kingdom ............... 9007492

[51] Int. Cl.⁵ .................. H03K 3/26; H01L 25/00
[52] U.S. Cl. .................. 307/303; 307/303.1; 307/465.1; 307/490; 307/465; 328/167; 328/158
[58] Field of Search ............ 307/303, 303.1, 468; 328/167, 127, 142, 158

[56] References Cited

U.S. PATENT DOCUMENTS

| 3,979,582 | 9/1976 | Mims ................................. 328/167 |
| 4,835,590 | 5/1989 | Ueno et al. ........................ 357/51 |
| 4,882,289 | 11/1989 | Moriuchi et al. .................. 437/52 |
| 4,888,628 | 12/1989 | Bergemont ....................... 357/23.6 |
| 4,888,631 | 12/1989 | Azuma et al. .................... 357/23.6 |
| 4,905,064 | 2/1990 | Yabu et al. ....................... 357/23.6 |

FOREIGN PATENT DOCUMENTS

| 0139427 | 5/1984 | European Pat. Off. . |
| 0296586 | 12/1988 | European Pat. Off. . |
| 1301131 | 12/1972 | United Kingdom . |
| 1426539 | 3/1976 | United Kingdom . |
| 1443361 | 7/1976 | United Kingdom . |
| 1596337 | 8/1981 | United Kingdom . |

OTHER PUBLICATIONS

Bruton, "Time-Multiplexed Active Filters", IEEE J. S-SC, vol. SC-7, No. 3 Jun. 1972, pp. 259-265.

Primary Examiner—Timothy P. Callahan
Attorney, Agent, or Firm—Sughrue, Mion, Zinn Macpeak & Seas

[57] ABSTRACT

This invention relates to semiconductor integrated circuits which find utility in analogue systems. An integrated circuit of the invention comprises an array of configurable analogue cells each of which is capable of interconnection with other cells in the array by means of an interconnection network. Each of the cells can be selectively and individually selected by means of select signals and emanating from shift registers. When selected the cell may be configured with configuration data which both sets the cell to take up a particular electrical configuration by means of digital data and sets various programmable resistors and capacitors in the cells to particular values by means of analogue signals. The configuration data is held in a random access memory. Some of this data is converted to analogue form by means of a digital-to-analogue converter. The circuit is controlled by a central control and is capable of being configured to implement particular analogue functional applications from a plurality of possible analogue functional applications. Provision in the circuitry is made to automatically compensate for manufacturing component tolerances.

21 Claims, 22 Drawing Sheets

INTEGRATED CIRCUIT FOR ANALOGUE SYSTEM

BACKGROUND OF THE INVENTION

The present invention relates to semiconductor integrated circuits which find utility in analogue systems.

Known analogue circuits for instance, graphic equalizers, audio music synthesizers, special purpose filters, spectrum analyzers, and so on, employ design and manufacturing techniques which involve the use of discrete components on printed circuit boards. Such circuits are generally quite bulky, labor intensive in assembly processing, give rise to reliability problems and as a consequence are relatively costly.

Analogue circuits of the above mentioned type have been fabricated in semiconductor integrated form, however, there are difficulties in using current manufacturing processes in producing integrated circuits with accurate resistor values and large value capacitors. Nevertheless, integrated circuits such as operational amplifiers, oscillators and phase lock loops do exist, but these circuits have the disadvantage of having to be specially manufactured for the particular application exclusively, which is extremely costly.

An aim of this invention is to overcome the aforementioned disadvantages and problems by the provision of a relatively inexpensive standard semiconductor integrated circuit which is suitable for a wide range of functional applications without the requirement for any major change in the manufacturing processes of such integrated circuits.

SUMMARY OF THE INVENTION

According to this invention there is provided a semiconductor integrated circuit comprising an arrangement of a plurality of configurable analogue cells each cell being capable of interconnection with other cells of the arrangement by means of an interconnection network, wherein each analogue cell is capable of being selectively and individually accessed with cell configuration data to internally configure the cell and affect interconnection of the accessed analogue cell with other analogue cells of the arrangement to implement a particular analogue functional application from a plurality of possible analogue functional applications.

Preferably the semiconductor integrated circuit further comprises first data paths incorporating switch control paths and the interconnection network includes associated switch circuits, wherein cell configuration data stored in storage means in digital form is directed to an individually accessed selected cell in digital form over a switch control path to effect operation of the associated switch circuits and interconnection of the selected analogue cell with other analogue cells of the arrangement.

Preferably the switch circuits each include a storage means to store configuration data and a transistor switch serving as an interconnecting device.

Conveniently the interconnection network preferably comprises a global interconnect system and a local interconnect system wherein the global interconnect system is employed to interconnect any cell to any other cell which is located at a distance within the arrangement and the local interconnect system is employed to interconnect the output of each cell to the inputs of neighbouring cells.

An analogue cell preferably comprises, an amplifier, programmable analogue components, switching means and signal paths, and wherein to implement any predetermined analogue circuit, the analogue components are programmed for required intrinsic values and the switching means are utilised to interconnect the programmed components and signal paths in a particular predetermined configuration.

Preferably and conveniently, the intrinsic component values are stored in digital form in the storage means. It is preferable for the arrangement to include selection signal paths adapted for selecting individual analogue cells and the cell selection signals to emanate from signal generating means under the control of a central control means and the cell selection signals to be successively directed to the selection signal paths associated with individual analogue cells.

The arrangement also preferably includes second data paths for providing analogue data to each analogue cell the analogue data having been converted from digital cell configuration data by digital-to-analogue conversion means, wherein the analogue data is directed over the second data paths to the selected cell.

Advantageously the analogue data preferably comprises a plurality of separate analogue signals each of which represents a particular value of a component which is to be programmed in the analogue cell.

Preferably the arrangement of the plurality of configurable analogue cells takes the form of an array where the cells are arranged in rows and columns.

Conveniently and preferably the signal generating means comprises a first programming shift register and a second programming shift register wherein the first programming shift register provides horizontal coordinate reference signals within the array, whereas the second programming shift register provides vertical coordinate reference signals within the array, the horizontal and vertical coordinate reference signals enabling selection of any analogue cell within the array.

The global interconnect system preferably includes horizontal global bus lines running horizontally between the rows of analogue cells and vertical global bus lines running vertically between the columns of analogue cells.

Preferably at all edges of the array there are provided switch blocks which enable the vertical and horizontal global bus lines at the edges of the array to be directly interconnected.

The semiconductor integrated circuit is preferably adapted to produce a programmable resistor component which comprises a pair of matched characteristic field-effect transistors having gate, source and drain electrodes, wherein the first transistor of the pair serves as a reference transistor and the second transistor of the pair serves to provide the actual resistor value.

The semiconductor circuit preferably further comprises, a differential amplifier, an adjustable constant current source, and first and second reference potentials, and wherein the constant current source serves as a load for the reference transistor said reference transistor being connected to provide a negative feedback path to the differential amplifier whereby the operation of the differential amplifier is arranged to adjust the gate electrode voltage of said reference transistor until a specific voltage drop relative to the first and second reference potentials appears across said reference transistor to thereby establish a predetermined resistance between the source and drain electrodes of said reference transistor and whereby the gate electrode voltage of said reference transistor is arranged to directly control the conductance of the second transistor of said matched characteristic field-effect transistors to set the required resistor value.

Conveniently and preferably the semiconductor integrated circuit is adapted to produce a linear resistor by the provision of a complementary pair of matched characteristic field-effect transistors of opposite polarity types whereby the second transistors of each matched characteristic field-effect transistors are connected in parallel and whereby in operation of said second transistors a linear transfer characteristic function is achieved.

Each programmable resistor preferably comprises a resistor network including a plurality of pairs of opposite polarity field-effect transistors being arranged to be capable of producing different ranges of resistor values, wherein a particular range is selected by cell configuration data extending over a data bus incorporated in said first data paths to a memory means whose output is adapted to switch the selected range of resistors into operation.

The adjustable constant current source is adjusted by means of the analogue signals.

The integrated circuit preferably includes programmable capacitor components which include at least one capacitor multiplier circuit.

Advantageously and preferably each opposite polarity field-effect transistor has an associated capacitive analogue storage circuit capable of storing and retaining an analogue potential on the gate electrode of said reference transistor when said specific voltage drop is attained.

Preferably manufacturing component tolerances for all analogue components are automatically compensated for by a single external resistor and a single internal capacitor.

BRIEF DESCRIPTION OF THE DRAWINGS

The invention will be more readily understood from the following description of several exemplary embodiments which should be read in conjunction with the accompanying drawings in which.

DESCRIPTION OF THE PREFERRED EMBODIMENT

This invention provides in an exemplary embodiment a user programmable linear array, consisting of operational amplifiers employing semiconductor MOS field-effect transistors, capacitors, resistors, voltage dependent resistors and switches fabricated in semiconductor integrated form. The array consists of forty-nine core cells (28 basic and 21 enhanced) comprising operational amplifiers with configurable interconnects that allow the user to realize complex analogue circuit functions. Programmable resistors and capacitors are provided to enable the designer to implement many analogue circuit functions.

Figure 1:
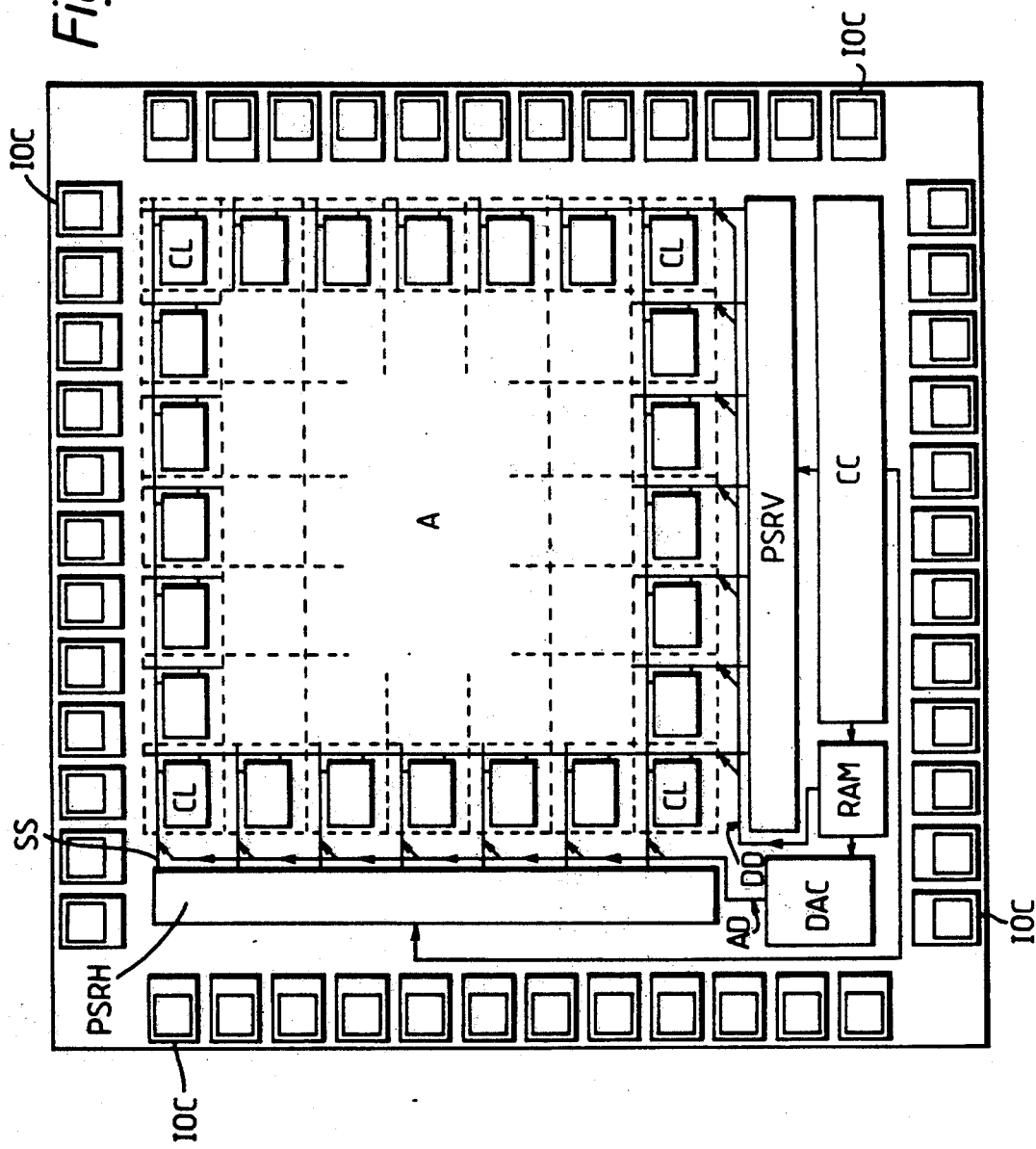
FIG. 1 is a schematic diagram of a semiconductor integrated circuit in the form of a linear array according to this invention.

Referring to the drawings it should be understood that all designations RN in figures of the drawings represent the two nodes of a programmable resistor. Referring now to FIG. 1, it will be seen that the cells CL are arranged as alternating columns in a seven by seven array and these cells may be interconnected by means of an interconnection network. The interconnection network comprises bus lines running vertically and horizontally between the rows and columns of cells. Running vertically between the columns of cells are four global bus lines VB (see FIG. 5) and running horizontally between the rows are two global bus lines HB. Cells are capable of connecting directly to either of these bus resources by means of switch elements IS1, IS2, IS3 and IS0. Additionally, at the edge of the array, switch blocks (designated ES in FIG. 5) allow horizontal and vertical buses to be directly interconnected.

It is arranged that over one hundred, five nanofarad capacitors may be implemented using a capacitive multiplier technique and over two hundred resistors may be programmed for a range of individual values between 10K ohms and 640K ohms. Multiplier functions may be implemented using combinations of voltage dependent resistors and operational amplifiers.

Manufacturing component tolerances are automatically compensated to ensure reliable operation. All the internal programmable resistors and capacitors are compensated by a single external resistor and a capacitor.

The device is suitable for a wide range of analogue functional applications including the replacement of most existing low frequency analogue integrated circuits (IC's), and provides a high level of integration through the use of novel circuit techniques.

Conventional analogue integrated circuits requiring high value capacitors and resistors are of limited complexity due to the very large area of silicon that is required for the fabrication of these passive components. A single one nanofarad capacitor, for instance, would normally consume the whole area of the die.

Programmable resistors therefore are normally implemented using a switched capacitor technique. This approach however has limited application for a programmable device, as each resistor would require a separate clock source in order to generate the appropriate individual resistance. Furthermore switch capacitor techniques have a reduced signal bandwidth.

Some typical analogue functional applications for this device are listed below:
 GRAPHIC EQUALIZERS
 AUDIO MUSIC SYNTHESIZERS
 AUDIO MIXER DESKS
 SPECIAL PURPOSE FILTERS
 SPECTRUM ANALYZERS
 SIGNAL GENERATORS
 BREAD BOARDING/PROTOTYPING
 HANDS FREE CIRCUITS FOR TELEPHONES
 MOST LOW FREQUENCY LINEAR IC REPLACEMENT
 EDUCATION FIG. 1 illustrates the so-called floor plan of the device. The device consists of an array A of programmable analogue core cells CL each of which contains dynamic analogue circuitry that requires refreshing to maintain its circuit configuration and component values. Configuration data is held in an on-chip 4,800 bit static random access memory RAM. This configuration data source is continuously read to provide the refresh function.

Configuration data which is stored in the random access memory RAM, can be reconfigured from an external source in order to implement new circuits within the array as required.

The random access memory RAM can be battery backed to provide retention of circuit configuration data after power down if required. The small back-up battery could be incorporated into the integrated circuit packaging.

Circuit configuration data is accessed to configure internal interconnect sequential selection of the core cells CL by means of programming shift registers PSRH and PSRV under control of a control circuit CC. This configuration data is supplied to the interconnect resources and programmable resources in digital form over first data paths DD. Component values, stored in digital form in the random access memory RAM, are supplied to programmable resources over second data paths AD is analogue form via a digital-to-analogue converter DAC. Each programmable resource has a separate addressable sample and hold circuit (e.g., switches M1 and M2, together with the analogue storage circuit N/STR and P/STR) and configuration data is written to each sample and hold circuit sequentially.

Although in the present exemplary embodiment the programming shift registers PSRH and PSRV, digital-to-analogue converter DAC, random access memory RAM and control circuit CC are shown on the semiconductor integrated circuit with the array of cells it is quite feasible for these components to be included on a separate I.C. if required.

The sample and hold circuit (N/STR, P/STR) controls a programmable voltage dependent resistor and each resistor is individually compensated to allow for manufacturing tolerances and temperature variations. Each programmable resistor is implemented as a pair of complementary MOS transistors. Each transistor of the pair has associated with it a second matched transistor that forms part of a control voltage feedback loop.

Capacitors are fabricated in values of $5E-12$ fared. The value of these capacitors is then multiplied in each case by two impedance converters to a final value of $5E-9$ farad. Each stage ($\times 33$) consists of a buffer and two programmable resistors.

Figure 2:
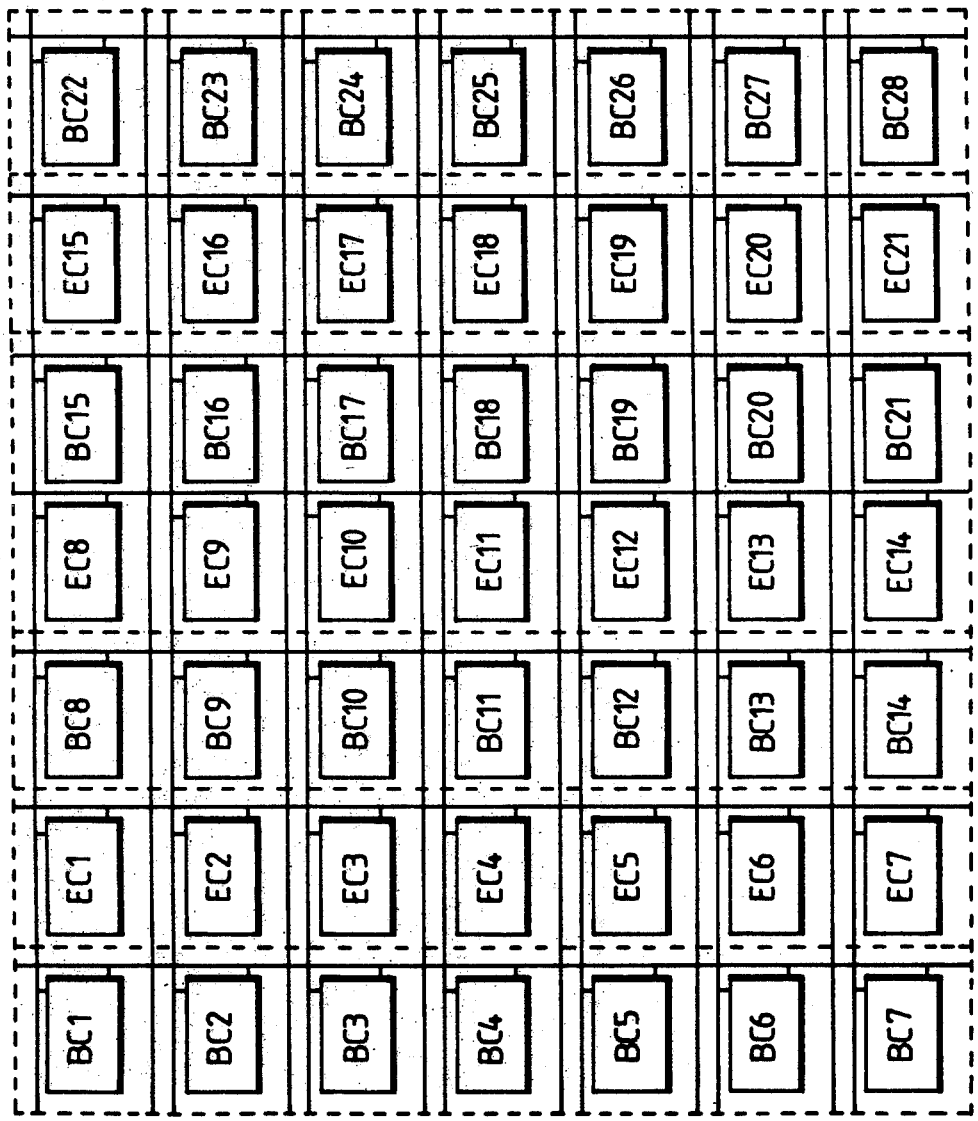
FIG. 2 shows a schematic diagram of the arrangement of the basic cell and enhanced cells in the linear array.
Figure 3:
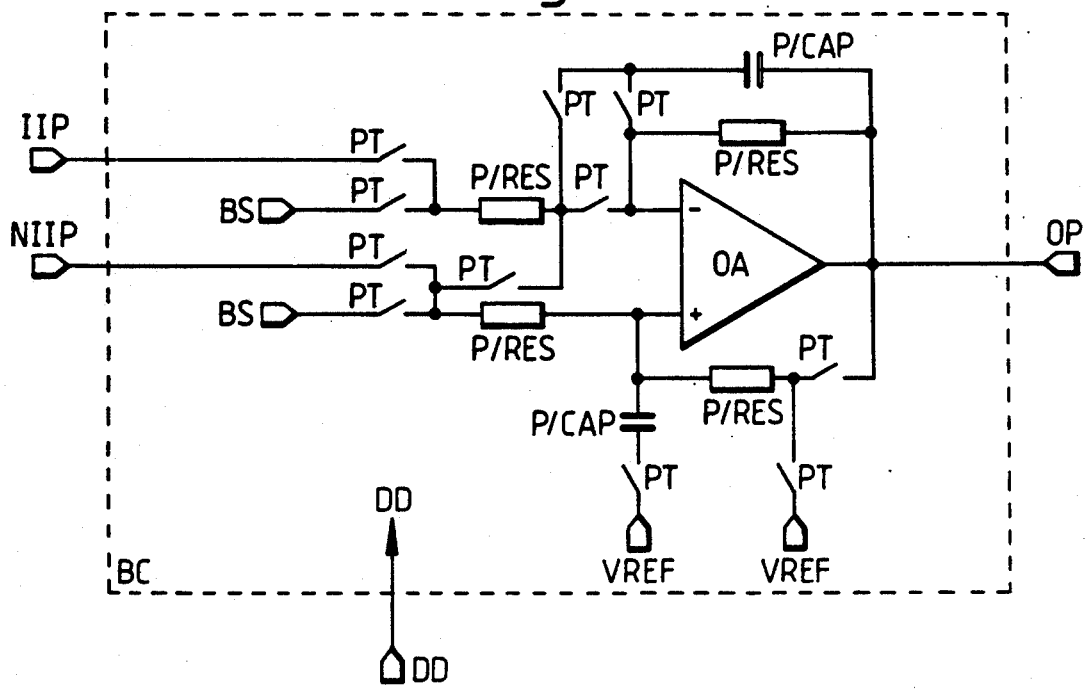
FIG. 3 shows a circuit of a basic cell.
Figure 4:
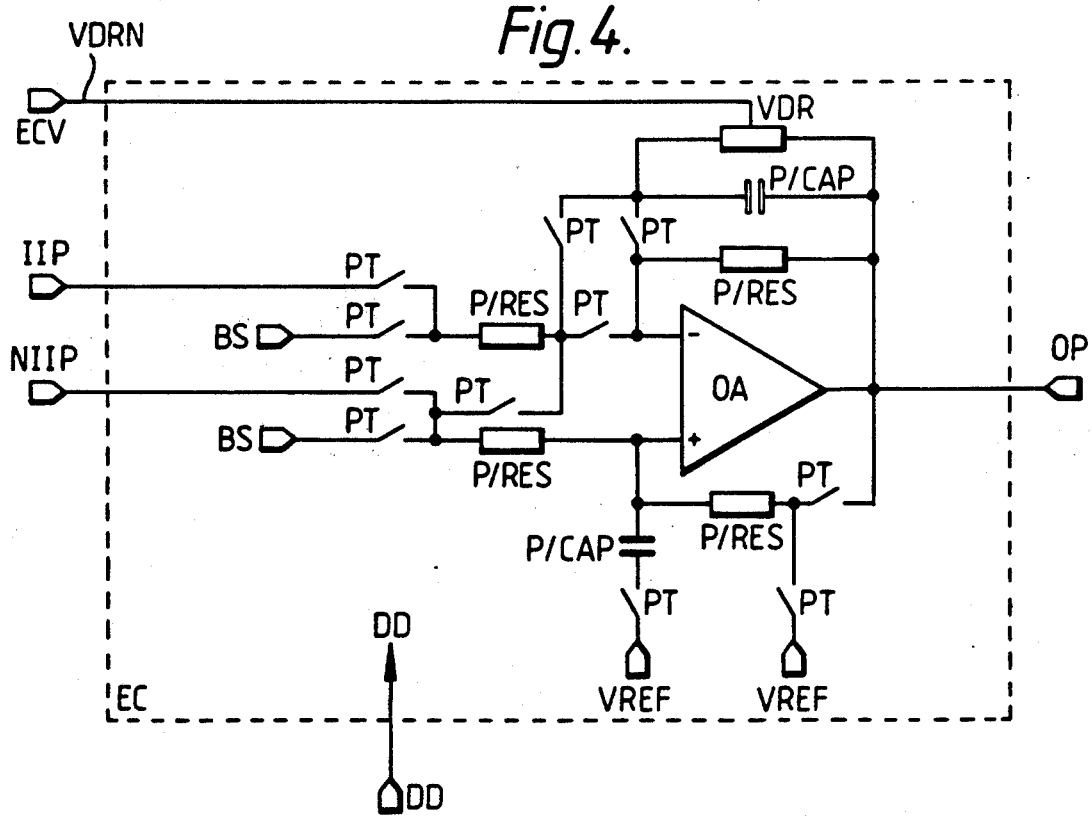
FIG. 4 shows a circuit of an enhanced cell.
Figure 10:
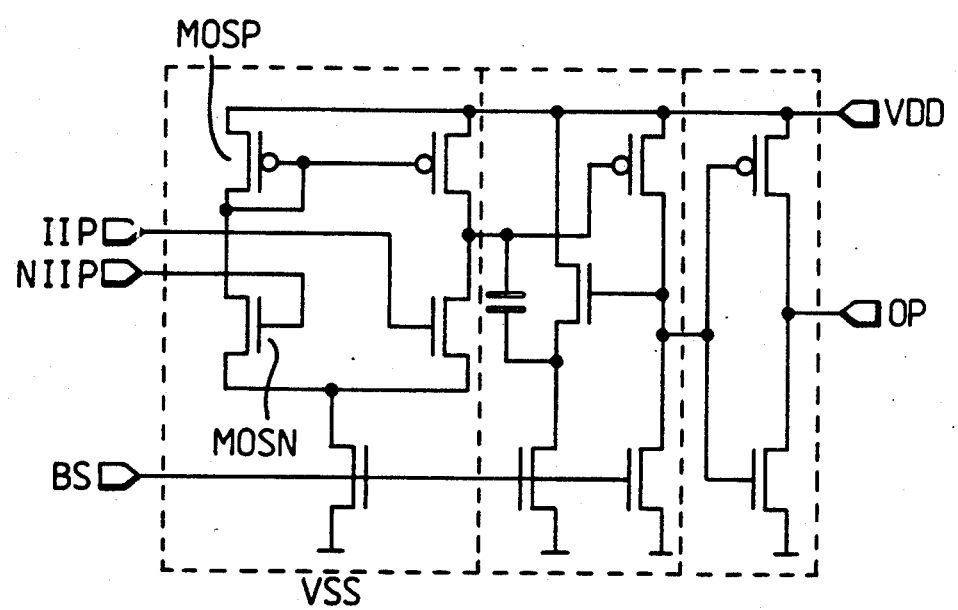
FIG. 10 shows a core cell operational amplifier circuit.

Within the array there are twenty-eight basic cells BC1 and BC28 and twenty one enhanced cells EC1 to EC21 (see FIG. 2). Each basic cell BC (FIG. 3) consists of one general purpose operational amplifier OA, four programmable resistors p/res and two programmable capacitors p/cap. Each enhanced cell EC (FIG. 4) consists of a high-speed operational amplifier OA, four programmable resistors p/res, two programmable capacitors p/cap, and one voltage dependent resistor VDR which can serve as an analogue switch. Both the basic cells BC and the enhanced cells EC have an inverting input IIP and a non-inverting NIIP and each incorporates bias voltages BS together with voltage reference sources VREF. The output OP is taken from each cell by way of the operational amplifier OA. Each enhanced cell operational amplifier OA may also be used as a comparator, linear integrator, or as a multiplier when used in conjunction with the voltage dependent resistor or analogue switch. This is particularly useful for companding, gain control and modulation. FIG. 10 shows a circuit of a core cell operational amplifier which is generally of known standard type incorporating MOS field-effect transistors such as MOSN and MOSP and has a non-inverting input NIIP, an inverting input IIP and an output OP. VSS and VDD represent the voltage supply and BS represents a bias voltage.

Using the voltage dependent resistors VDR in the enhanced cells EC, external voltages ECV can be used by way of the voltage dependent resistor node VDRN (see FIG. 7) to control internal circuit responses within the enhanced cell EC. For example, using the array to implement a twenty-channel graphic equalizer, external potentiometers would not carry audio signals to and from the array, only the control voltages.

INTERCONNECT

Figure 5:
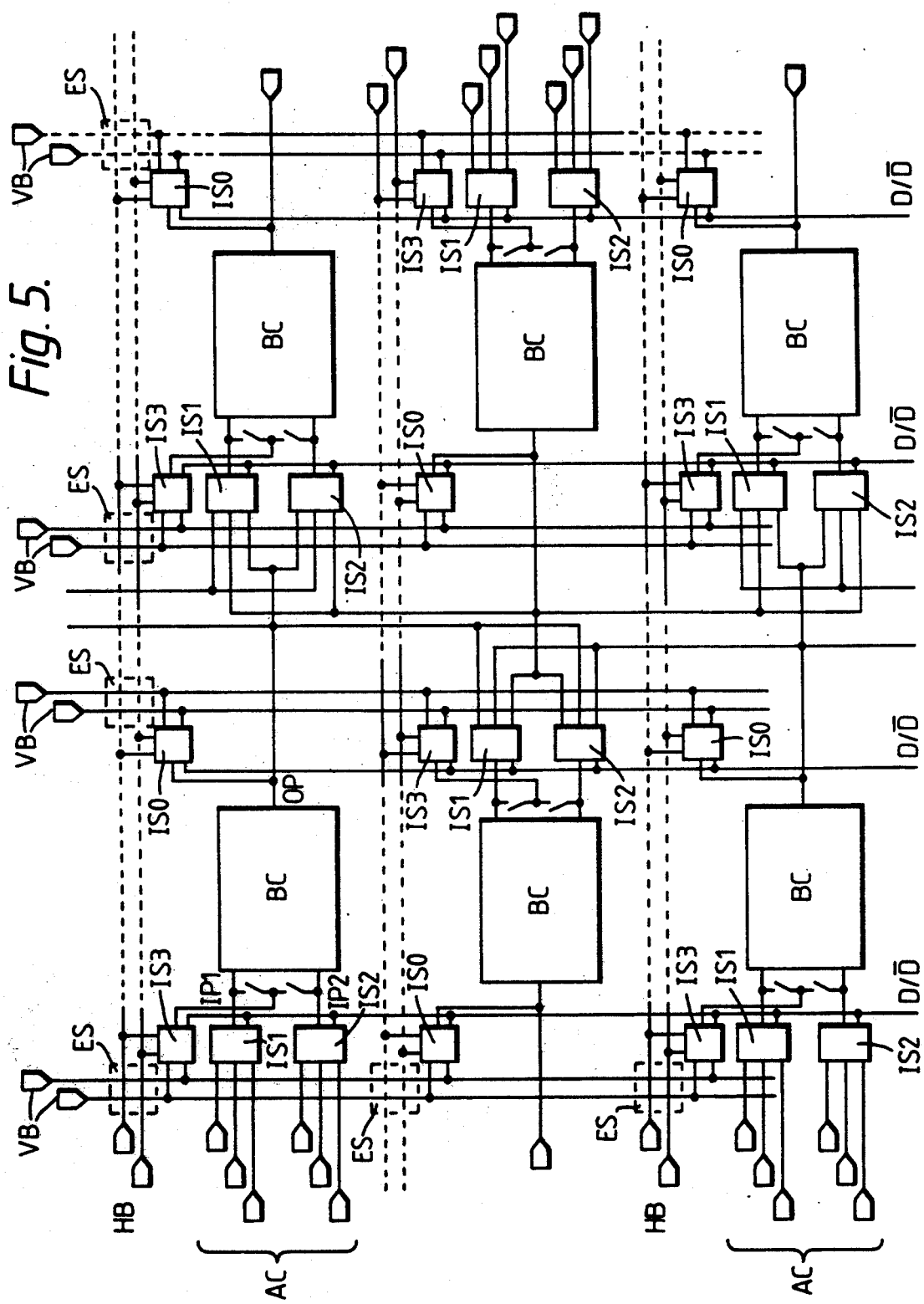
FIG. 5 shows a section of the array in more detail in particular the global interconnect details.
Figure 6:
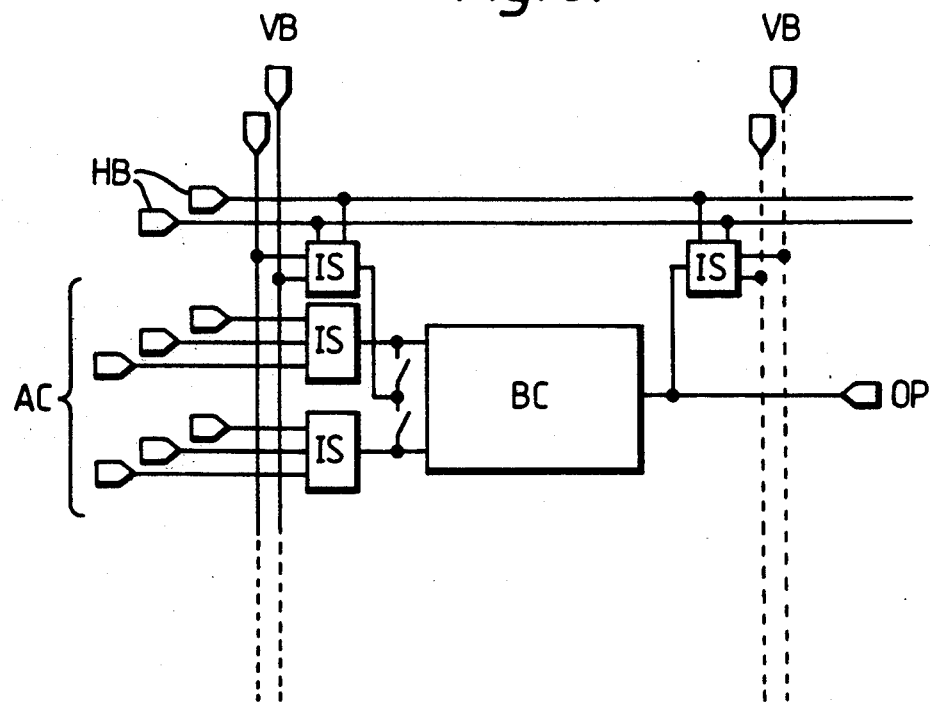
FIG. 6 shows the interconnect details around a basic core cell.
Figure 7:
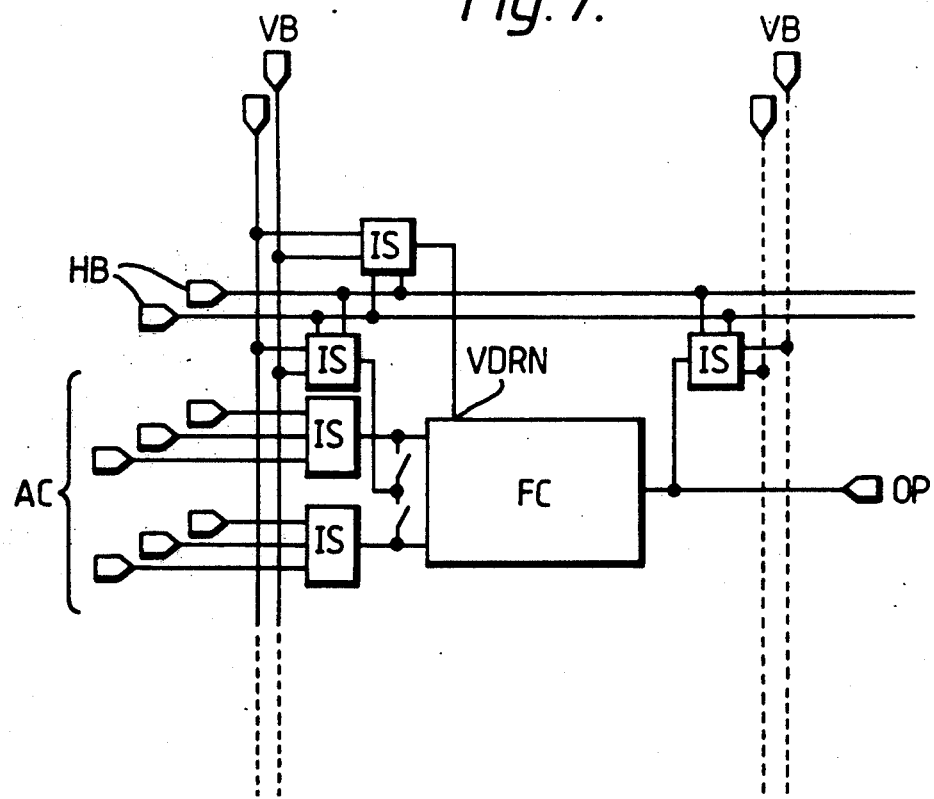
FIG. 7 shows the interconnect details around an enhanced core cell.
Figure 8:
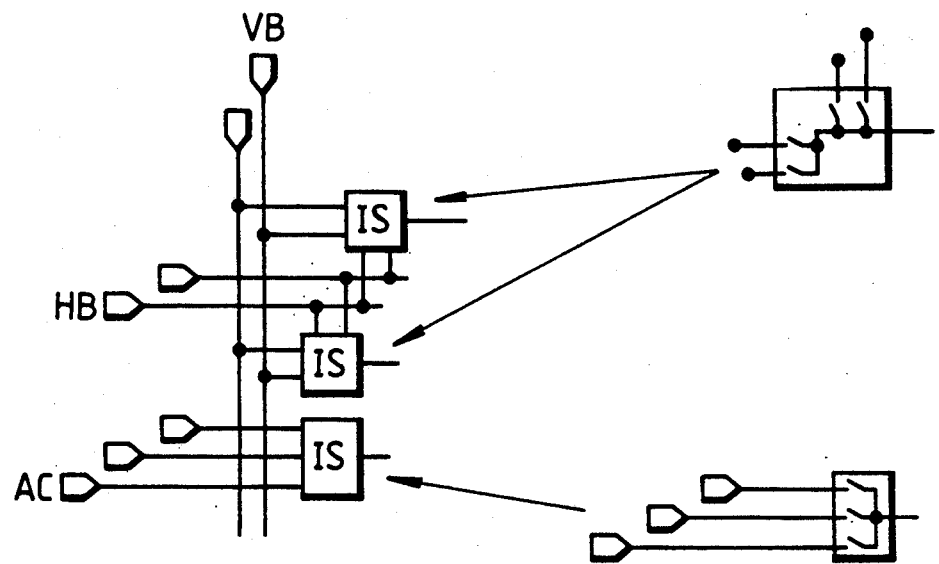
FIG. 8 shows the details of interconnect switches.

While each cell can be configured for the required circuit function by programming internal resistors and capacitors and connecting resources together over signal paths using pass transistors PT, within the array there is a global interconnect system comprising metal interconnect lines which are used for interconnecting cells over long distances within the array, i.e., not a neighboring cell. Local connections can be effected through a local interconnect system, where the output of each cell is interconnectable to each input of its neighbors within the array. FIGS. 5-7 illustrate the global interconnect connectivity and the local interconnect arrangements for a basic BC and an enhanced cell EC respectively. FIG. 8, shows details of the interconnect switch circuits IS.

Figure 9:
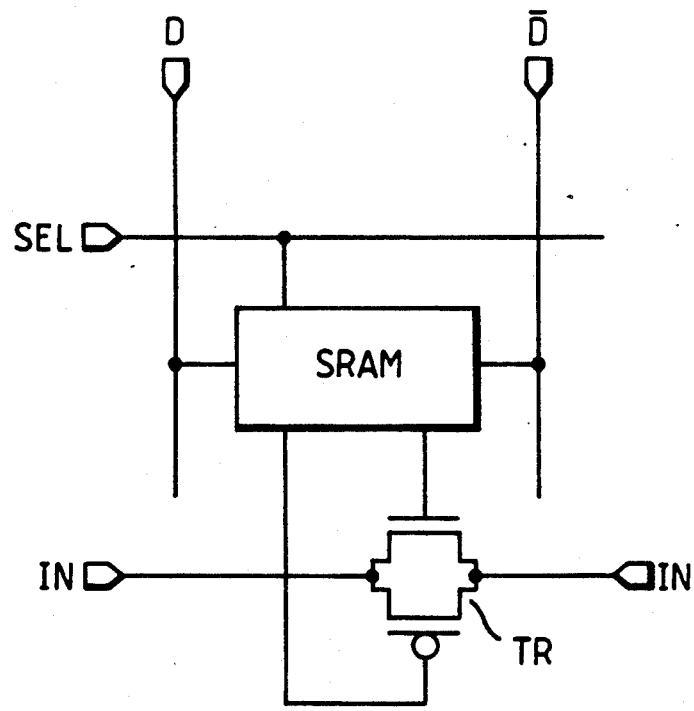
FIG. 9 shows a programmable switch circuit with a pass transistor controlled by a core cell random access memory.

Each interconnect resource is physically connected to each cell using a pair of P and N channel pass transistors controlled by a switch storage means in the form of a static random access memory SRAM. FIG. 9 is an illustration of a pass transistor TR and its associated random access memory SRAM forming a programmable switch circuit. Data busses or switch control paths, forming part of the previously mentioned first data paths, for controlling this switch circuit, are designated D and $\overline{D}$ (see FIG. 5). Each switch may be selected by means of the line SEL. The connections IN represent the interconnect nodes.

Cells within the device are embedded in a network of interconnect resources and switching blocks. Each cell BC (see FIG. 5) has associated with its two signal inputs IP1 and IP2 three switch blocks IS1, IS2 and IS3, two IS1 and IS2 capable of connecting locally to other cells (adjacent cells AC) and one IS3 capable of connecting to a global bus resource HB and VB. The output OP of each cell directly connects to adjacent cell switch blocks and in addition connects to a switch block IS0 capable of routing output signals onto a global bus resource HB and VB.

PROGRAMMABLE RESISTORS

A programmable resistor consists of voltage dependent programmable resistor elements, each element consisting of a pair of complementary MOS transistors.

Figure 11:
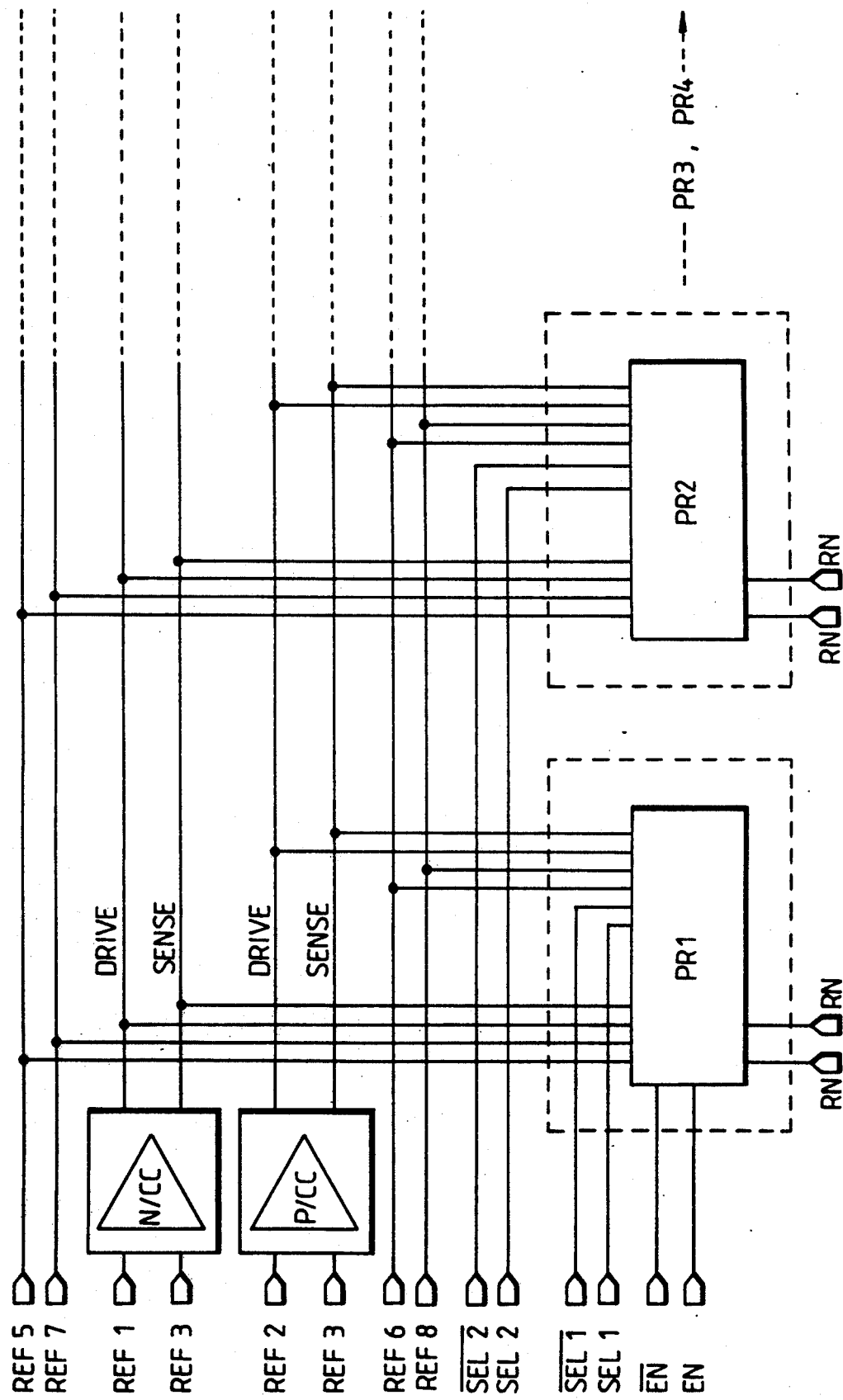
FIG. 11 shows a schematic diagram of a programmable resistor network.
Figure 12:
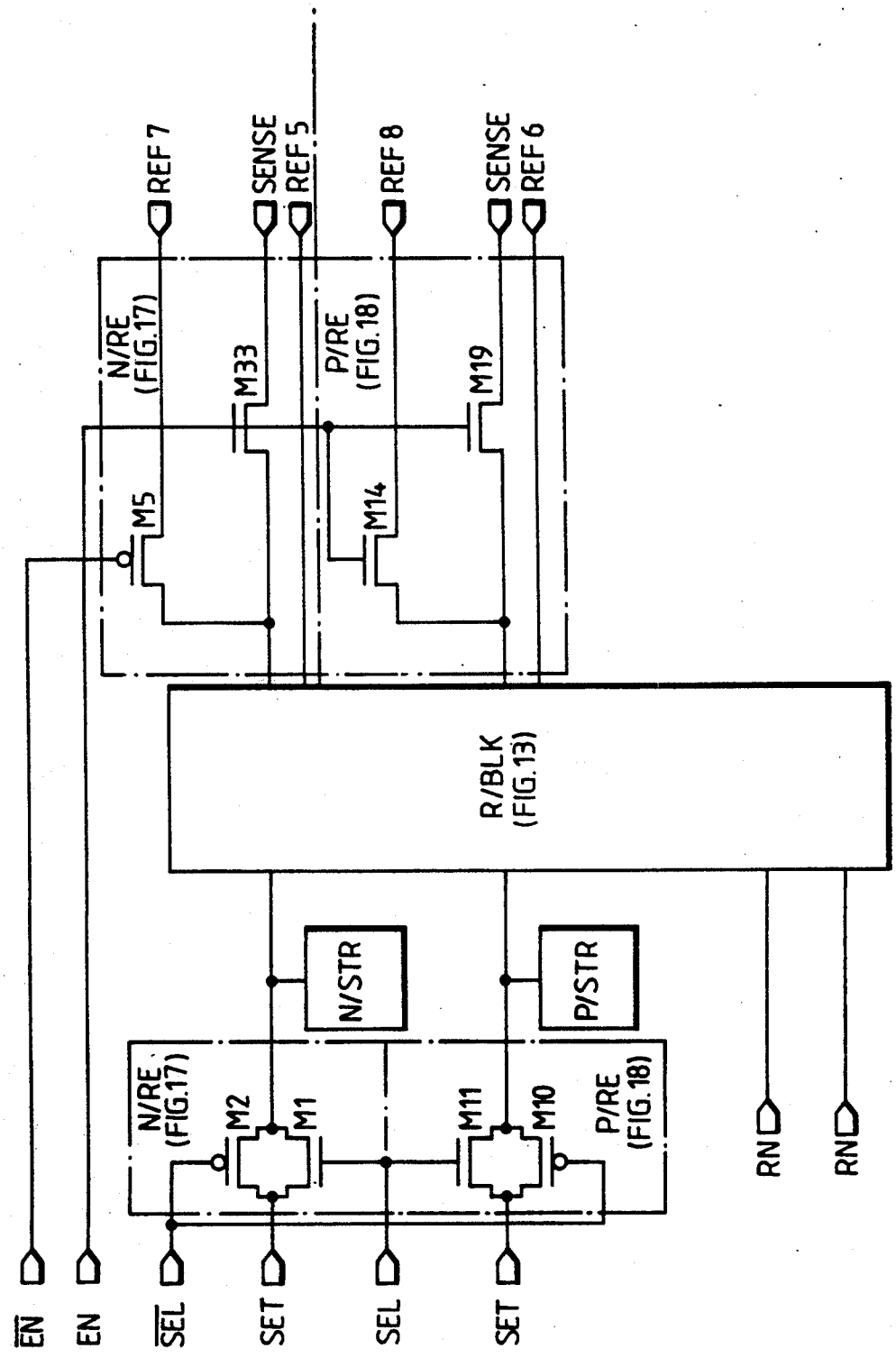
FIG. 12 shows a schematic diagram of a programmable resistor circuit.

FIG. 11 and FIG. 12 show the general arrangement for programming each resistor element. It should be noted that in FIG. 12, the portions of circuitry from FIG. 17 and FIG. 18 which are shown, have corresponding designations for the various components for the referenced figures.

Figure 13:
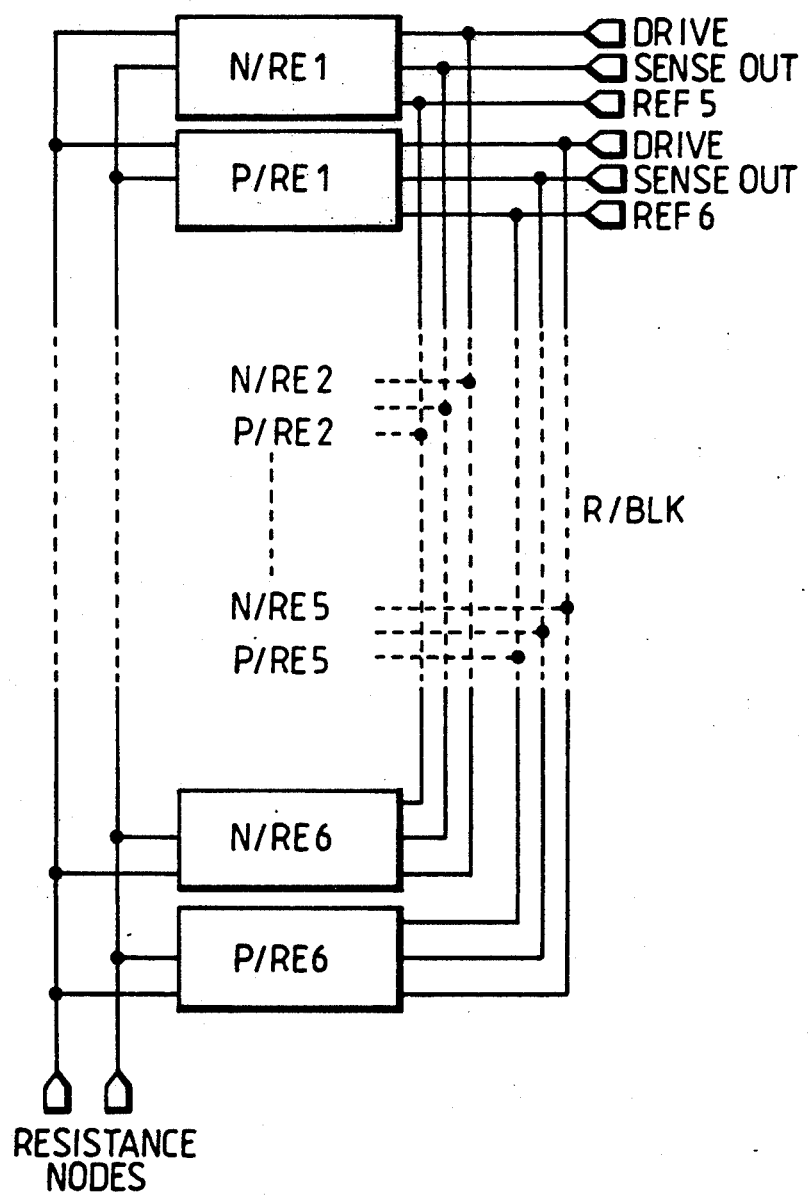
FIG. 13 shows a schematic diagram of a programmable resistor block.
Figure 27:
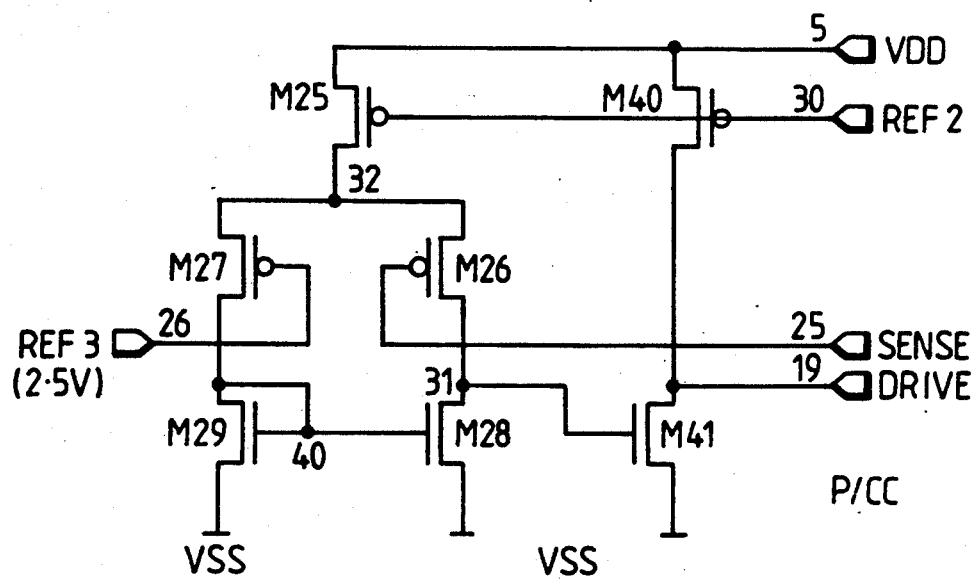
FIG. 27 shows a detailed circuitry of a 'P' channel control circuit/differential amplifier.
Figure 28:
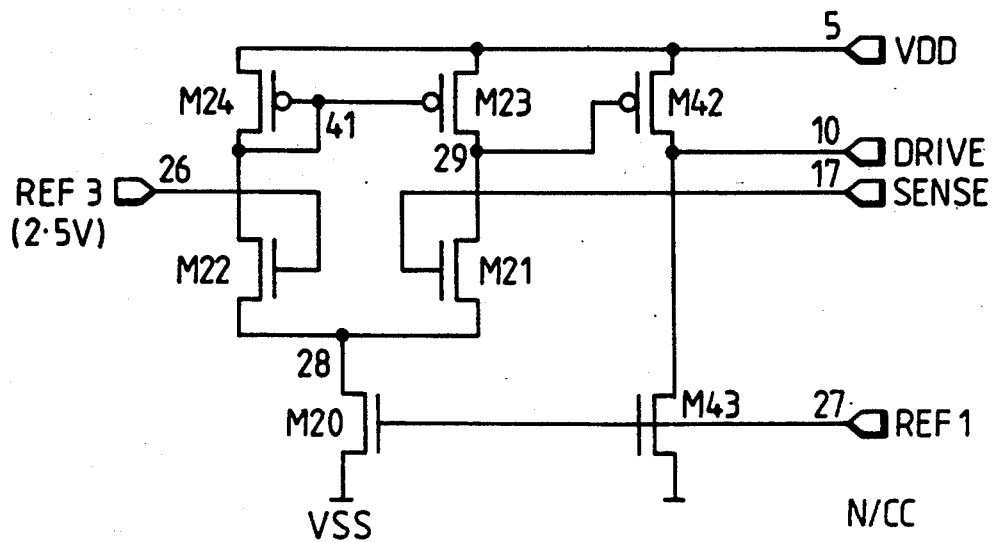
FIG. 28 shows the detailed circuitry of an 'N' channel control circuit/differential amplifier.

Referring to FIG. 11, N/CC and P/CC are both differential amplifiers, while PR1, PR2, PR3 . . . each comprise a programmable resistor network R/BLK, FIG. 12, FIG. 13. Each programmable resistor network has associated with it two analogue storage nodes N/STR and P/STR (FIG. 12). Each core cell (BC, EC) contains two differential amplifiers which sequentially set the correct control drive voltage for the voltage dependent programmable resistors. The analogue storage nodes N/STR and P/STR store the control drive voltage for the programmable resistor enabling the differential amplifiers N/CC and P/CC to set other programmable resources. The circuit details of the differential amplifiers are shown in FIG. 27 and FIG. 28.

Figure 14:
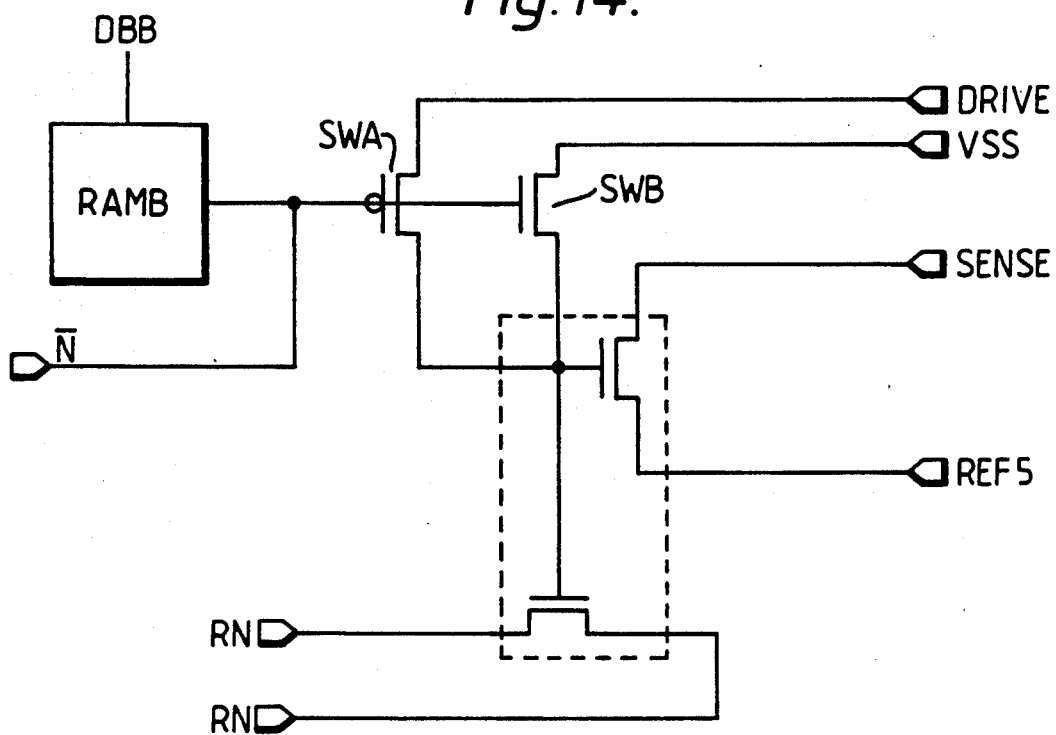
FIG. 14 shows an 'N' channel programmable resistor element switching arrangement.
Figure 15:
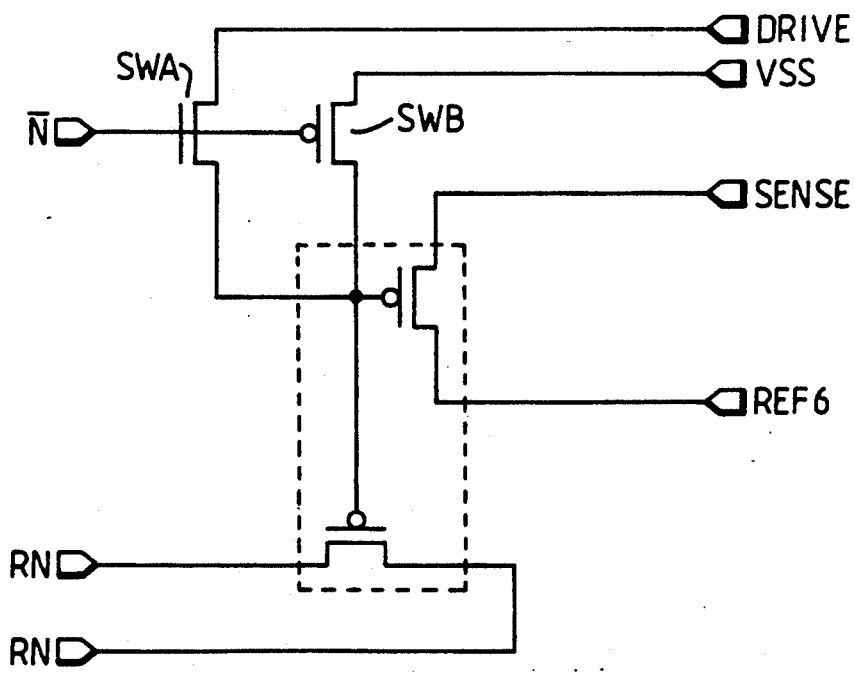
FIG. 15 shows a 'P' channel programmable resistor element switching arrangement.

FIG. 14 and FIG. 15 illustrate the basic 'P' and 'N' type programmable resistor elements respectively. Each resistor element is capable of providing thirty two resistor values within a 2:1 range, for example 10K ohms to 20K ohms in 32 steps, e. g., 10K, 10.31K, 10.62 k, etc.

Each programmable resistor is implemented (see FIG. 13) as six pairs of 'P' and 'N' resistor elements N/RE1, P/RE1 to N/RE6, P/RE6 ranging in value between 10K ohms to 640K ohms. Each element is connected in parallel with the previous element and is twice its value, for example 10K to 20K, 20K to 40K, etc.

Figure 20:
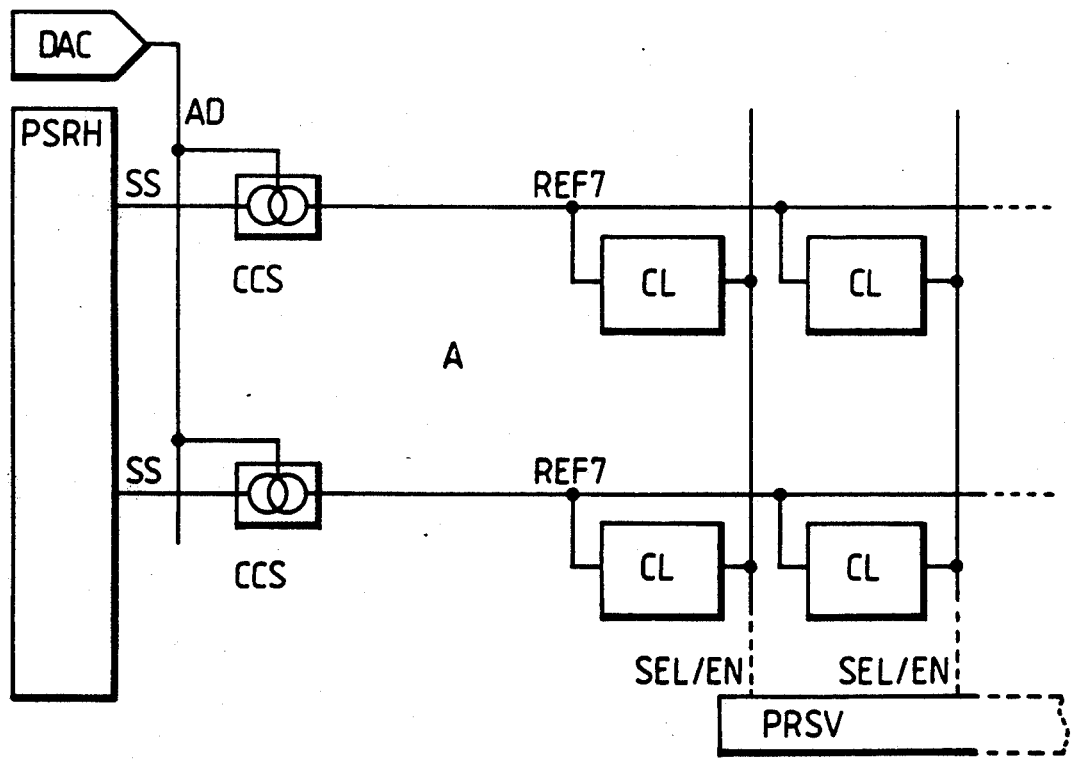
FIG. 20 shows a schematic diagram of an analogue programming circuit.

Referring now to FIG. 20 which illustrates the basic requirements for selecting a particular core cell CL in an array A. First, the appropriate row is selected, and consequently a particular constant current CCS, by select signals SS from the shift register PSRH, whereupon a specific current level, relevant to a particular desired resistor within a particular range of values, is programmed into the selected constant current source CCS by way of the second data paths AD by means of the digital-to-analogue converter DAC which has been programmed from the random access memory RAM (FIG. 1). This serves as one coordinate reference signal within the array. Second, the shift register PRSV provides an appropriate column select signal comprising enable signal EN and a select signal SEL to serve as the other coordinate reference signal within the array. The particular enable signal EN and select signal SEL together (SEL/EN) are arranged to select one of the resistors (PR1 to PR4) to be programmed by the current from the constant current source CCS. This is achieved during the programming process whereby one pair of the resistors from the six pairs of resistors in the resistor network of the selected resistor is selected by cell configuration data from the data bus DBB forming part of the first data paths, and which is stored in the random access memory RAMB (see FIG. 14 and FIG. 21 and FIG. 22). Resistor elements not selected are switched-out of the circuit.

Figure 21:
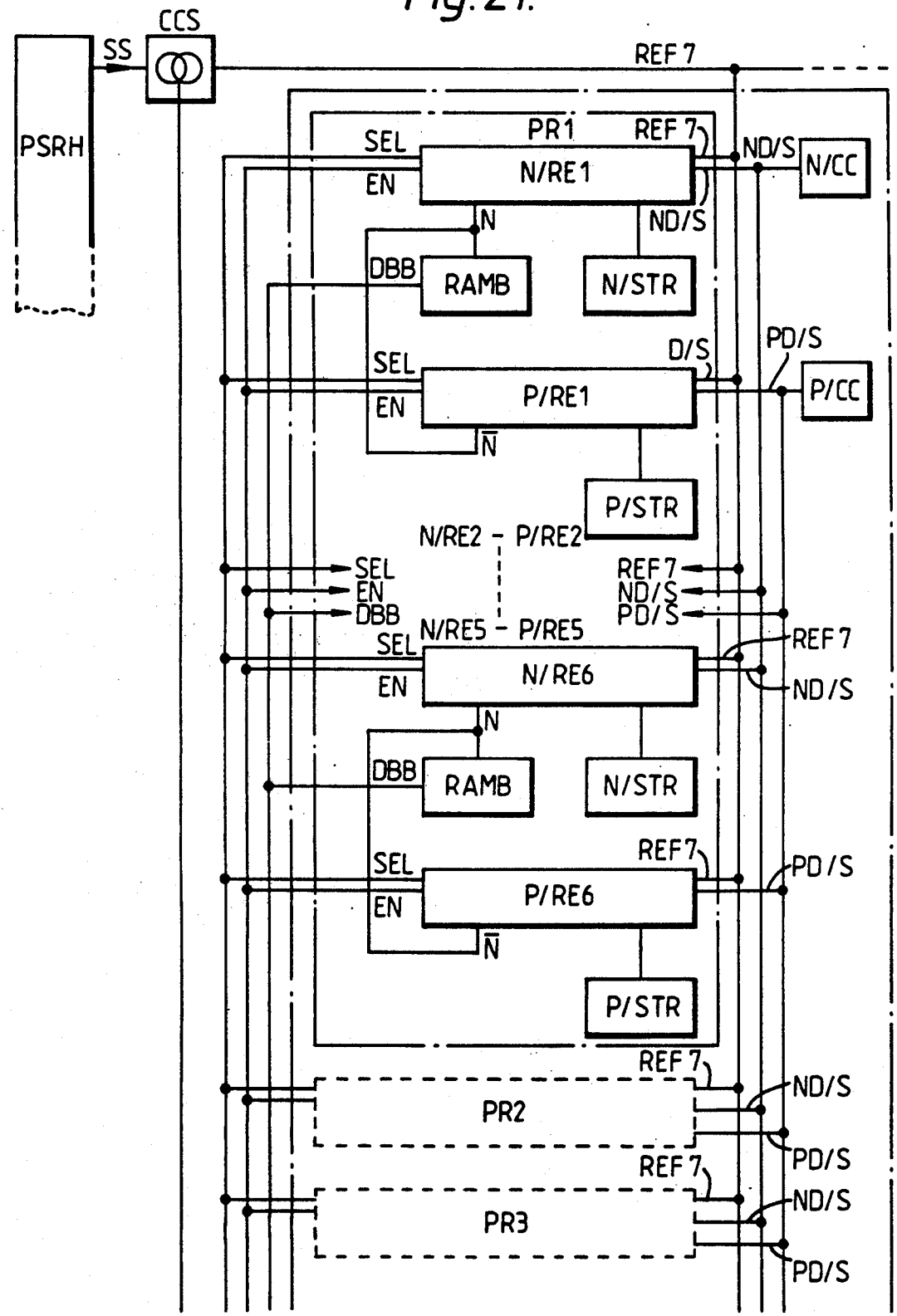
FIGS. 21 and 22, which should be arranged as shown in FIG. 23, show a more detailed schematic diagram of a typical basic cell and its programming arrangements.
Figure 22:
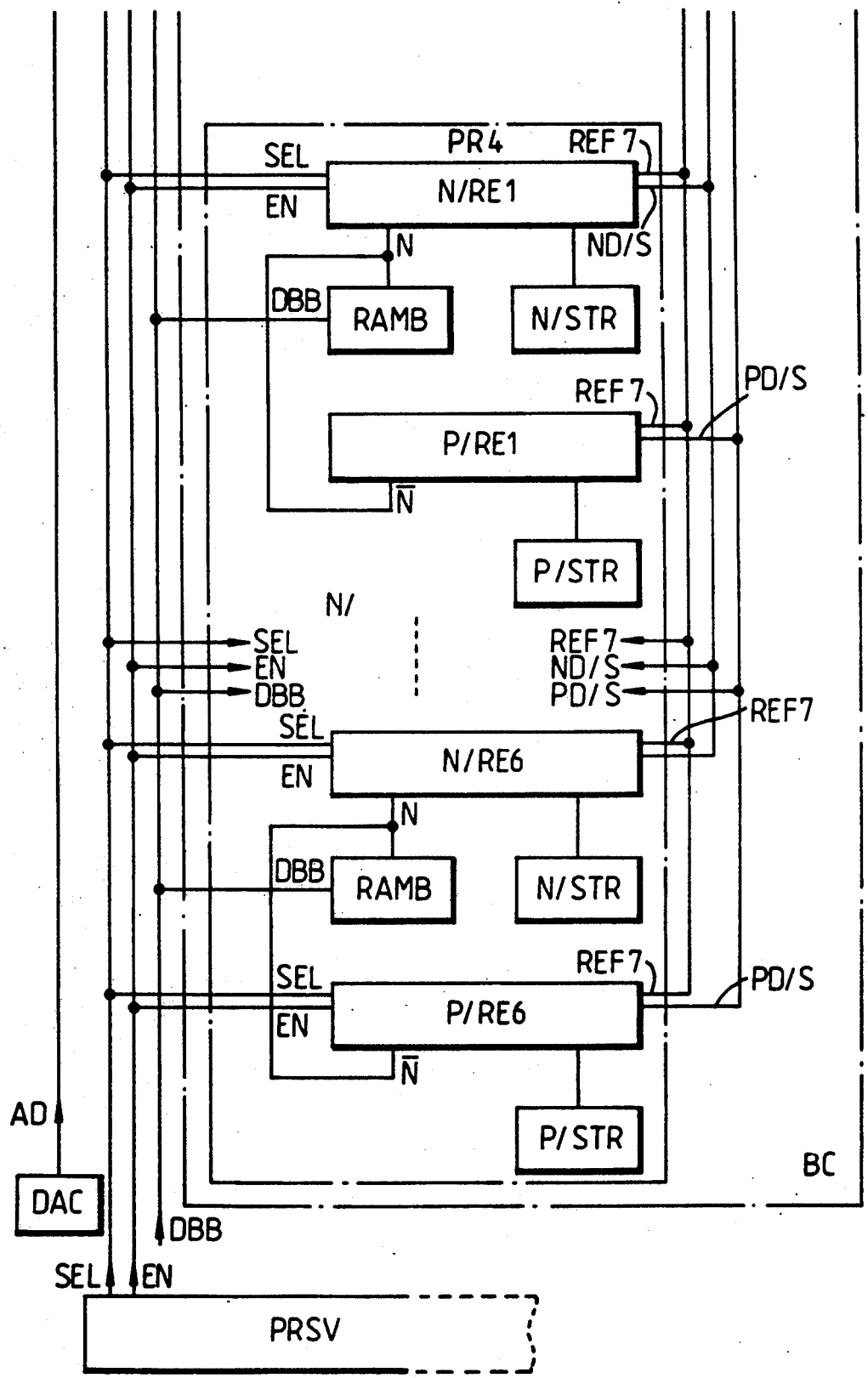
Figure 23:
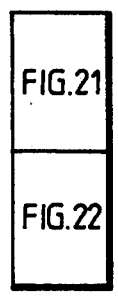

Referring now to FIG. 21 and FIG. 22 which should be arranged as shown in FIG. 23, the general arrangement of a basic cell BC is shown with four programmable resistors PR1 to PR4 (P/res, FIG. 3) each taking the form of a network R/BLK as shown in FIG. 13.

Figure 16:
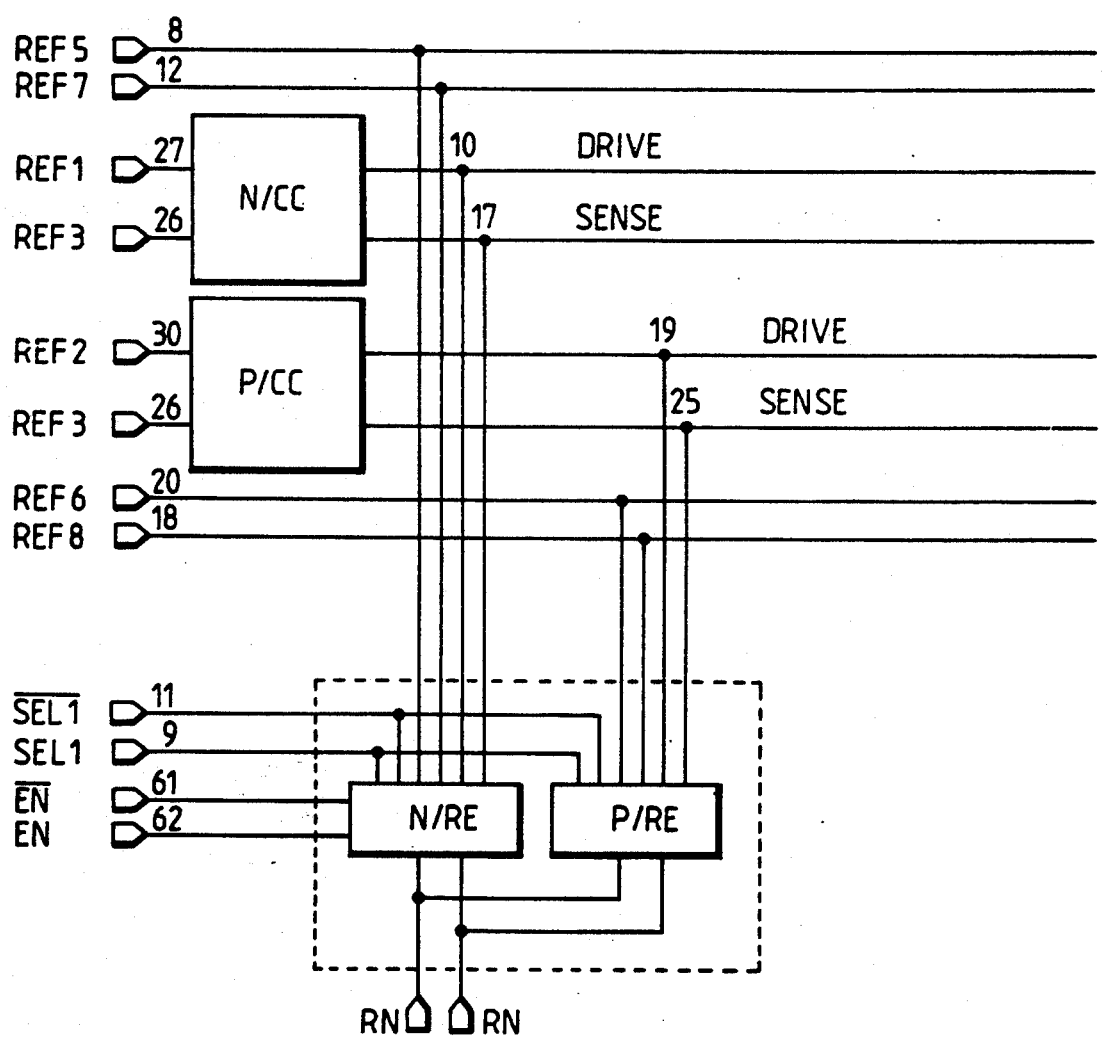
FIG. 16 shows a schematic diagram of a programmable resistor.
Figure 17:
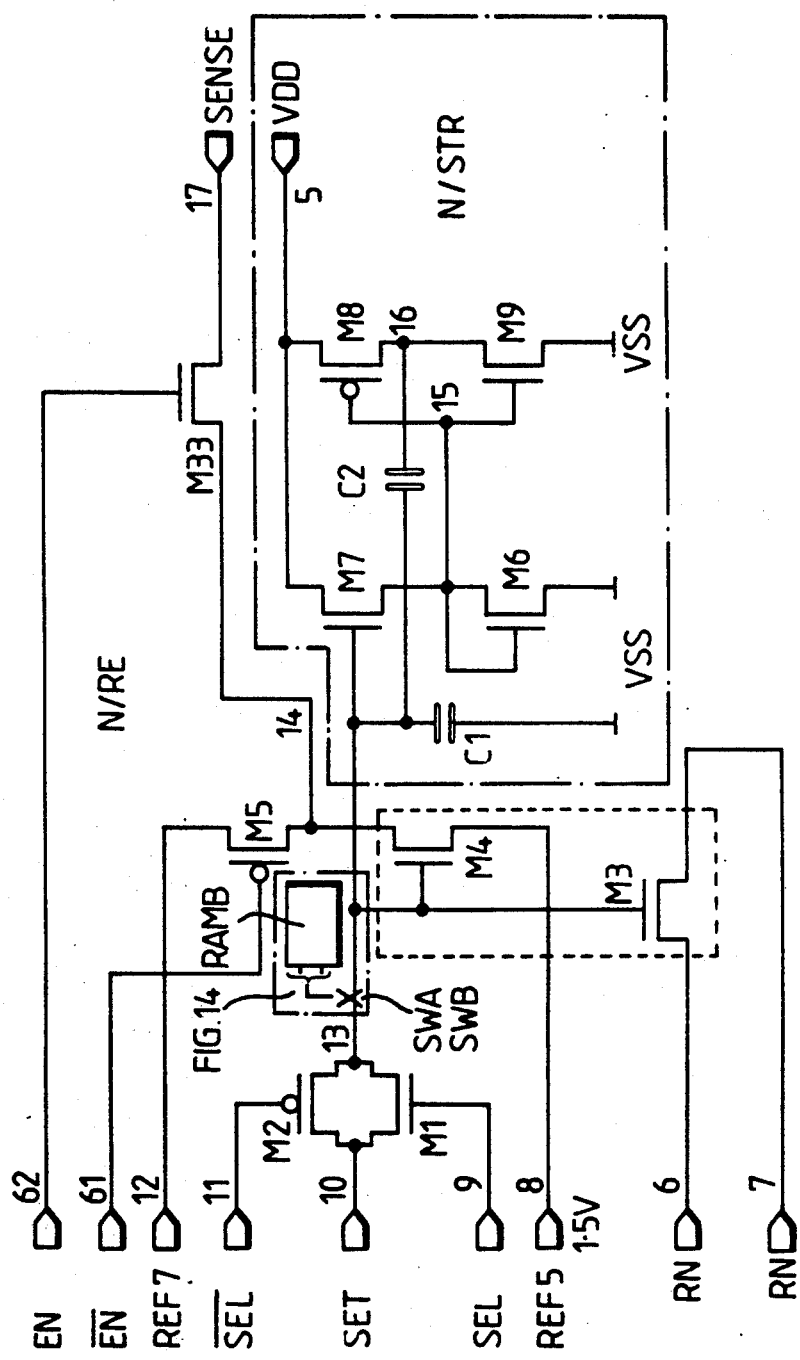
FIG. 17 shows a detailed circuit of an 'N' channel programmable resistor circuit.
Figure 18:
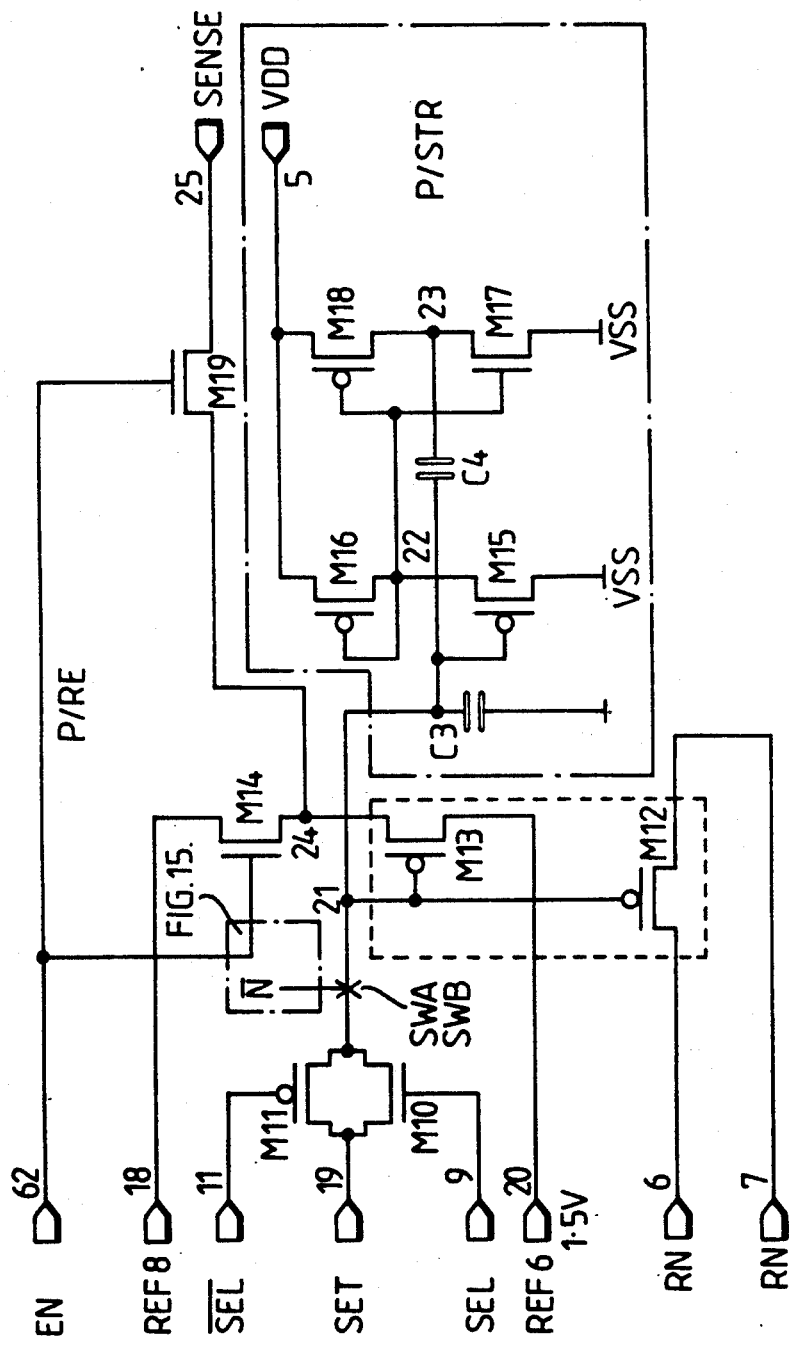
FIG. 18 shows a detailed circuit of a 'P' channel programmable resistor circuit.

Each resistor comprises the six pairs of resistor elements N/RE1, P/RE1 to N/RE6, P/RE6 previously mentioned and each has an associated analogue store N/STR, P/STR as previously indicated. Any pair of resistors and consequently a particular resistor value range can be selected by data on data bus DBB which is stored in the random access memory devices RAMB. Switches SWA and SWB (FIG. 14 and FIG. 15) are caused to operate to switch-in the appropriate resistor pair. The effect of this switching is shown diagrammatically in FIG. 17 and FIG. 18 where DRIVE (10, 19; FIG. 16) SET (10, 19; FIG. 17, FIG. 18) input can be controlled by switching switches SWA and SWB.

Referring again to FIG. 21 and FIG. 22, the horizontal (CCS, REF7) coordinate reference and the vertical (EN, SEL) coordinate reference are each shown together with differential amplifiers N/CC and P/CC previously referred to which serve the whole cell, and provide the necessary DRIVE and SENSE signals (ND/S, PD/S) for setting the resistor element to the desired value in the selected range.

Following this procedure where the shift registers PSRH and PSRV are progressively advanced the various components in all the cells can be programmed and set successively. For instance, row one is first selected, then row two and so on for each successive row, followed by the successive selection of each of the columns, each component being programmed and set in selected cells on a successive basis last and is twice its value, for example, 10K to 20K, 20K to 40K, etc.

During programming one pair out of six is selected by the data stored in the random access memory RAMB. Resistor elements that are not selected are turned off.

A further example of the programmable resistor circuit is illustrated in FIG. 16. N/CC and P/CC are the differential amplifiers, while N/RE and P/RE are both programmable resistor elements within a network. By referring to FIG. 16 and FIG. 17, it will be seen that the output of differential amplifier N/CC is arranged to drive (SET, 10) the gate of an 'N' type transistor M4 through the switch formed by transistors M1 and M2. The source connection of M4 is held at a reference potential of 1.5 volts (REF 5) and the drain of M4 is connected to transistor M5 which is in turn connected to a constant current source at terminal (REF 7). The junction of M4 and M5 is connected to the non-inverting input (17, SENSE-FIG. 28) of the differential amplifier N/CC through transistor M33 (FIG. 17), the inverting input (26, REF 3-FIG. 28) to the differential amplifier is connected to a reference potential of 2.5 volts.

The programmable resistor is implemented with transistor M3. The gate drive for M3 is derived from the gate potential of M4, which is part of a negative feedback path around differential amplifier N/CC (FIG. 17, FIG. 28).

To program the resistor to the required value, the constant current source CCS (FIG. 20) is adjusted to the appropriate current setting (0.1 mA for 10K ohms; 0.01 mA for 100K ohms; etc.) until the negative feedback path has stabilized. The stable condition for the differential amplifier is achieved when both of its inputs are at the same potential (2.5 volts). At this point the voltage drop across transistor M4 is equal to 1 volts (2.5−1.5, Ref. 5). Transistor M4 will then have a drain current equal to the constant current source. The potential at the gate of transistor M4 is now at a level for the required conductance of transistor M4. As the gate potential of transistor M4 is also connected to transistor M3, transistor M3 will also be programmed or set to the required resistance.

Referring to FIG. 13, FIG. 17 and FIG. 18, it will be appreciated that connected in parallel with transistor M3, and 'N' type transistor, is a 'P' type transistor M12. Transistor M12 with its associated circuitry perform a similar function to transistor M3 and its associated circuitry except that transistor M12 will have an inverse characteristic with respect to transistor M3. To implement a programmable resistor both transistors are necessary to ensure a linear transfer function.

ANALOG STORAGE MODE

Once the required drive for transistor M4 is established transistor M1 and M2 are switched off, the gate potential of M4 is maintained on capacitors C1 (200 fF) and (C2 400 f)F until it is refreshed 1E−3 seconds later. Two transistors are required to switch the gate drive to M4 in order to prevent corruption of the potential stored on C1 and C2 due to capacitive coupling of the driving signals on the gates of the switching transistors M1 and M2.

The potential applied to the gate of transistor M4 is also applied to a capacitor storage circuit formed around transistors M6 to M9 and capacitors C1 to C2. N/STR, P/STR illustrates the storage circuits (see FIG. 17 and FIG. 18). Transistors M8 and M9 form an inverting amplifier. The simple amplifier is only capable of operating near half the supply, transistors M6 and M7 provide a voltage level conversion function to enable the storage circuit to operate at voltages approaching VDD. The 'P' type programmable resistor element requires a storage circuit that can operate near voltage VSS.

Figure 19:
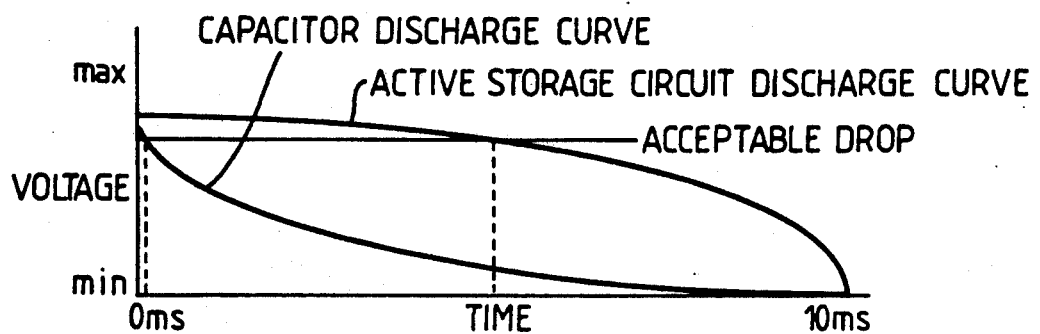
FIG. 19 shows a diagram of the characteristics of a storage node discharge function.

FIG. 19 illustrates the discharge characteristic of the storage circuit verses a simple capacitor circuit of the same capacitance, the improvement in the retention period that an acceptable voltage can be maintained can be clearly seen.

The storage circuit is required to maintain this analogue potential while the programming circuit is setting other resistors on the array. The active storage circuit generates the inverse of the normal exponential discharge characteristic of a capacitor and resistor. The storage circuit also resists modulation of the gate voltage caused by capacitive coupling between the gate and the source or drain regions of transistor M3 or transistor M12.

The capacitor used for storing the gate drive for transistors M3 and M4 has to be able to hold the charge without significant degradation until the next refresh period (1E−3 sec). Any variation in the potential across the capacitor will result in a change in the resistance of transistor M4, but more importantly transistor M3. This could have a catastrophic affect on the users circuit. If the circuit implemented is a filter the characteristics could change, i.e., a change in gain or phase. If the circuit has a high gain stage it could result in oscillation.

The effect of a changed resistance in transistor M4 is not the same as a fixed resistor tolerance as the resistance will change dynamically at the refresh rate. This will introduce a frequency of 1 Khz to the circuit node to which it is connected.

PROGRAMMING

Referring again to FIG. 20 which illustrates the global programming circuit. A digital-to-analogue converter DAC generates a voltage proportional to the required resistance or capacitance for each component in the core cell. The output of the digital-to-analogue converter DAC is converted at CCS to a current which is applied to the global load (REF 7) to provide the selected cell with the appropriate programming current. The digital-to-analogue converter DAC is driven by the on-chip random access memory RAM (see FIG. 1), which contains configuration data and component values in digital form. It should be noted that all the programmable components in the array are sequentially refreshed to maintain the correct individual component values.

PROGRAMMABLE CAPACITORS

Figure 24:
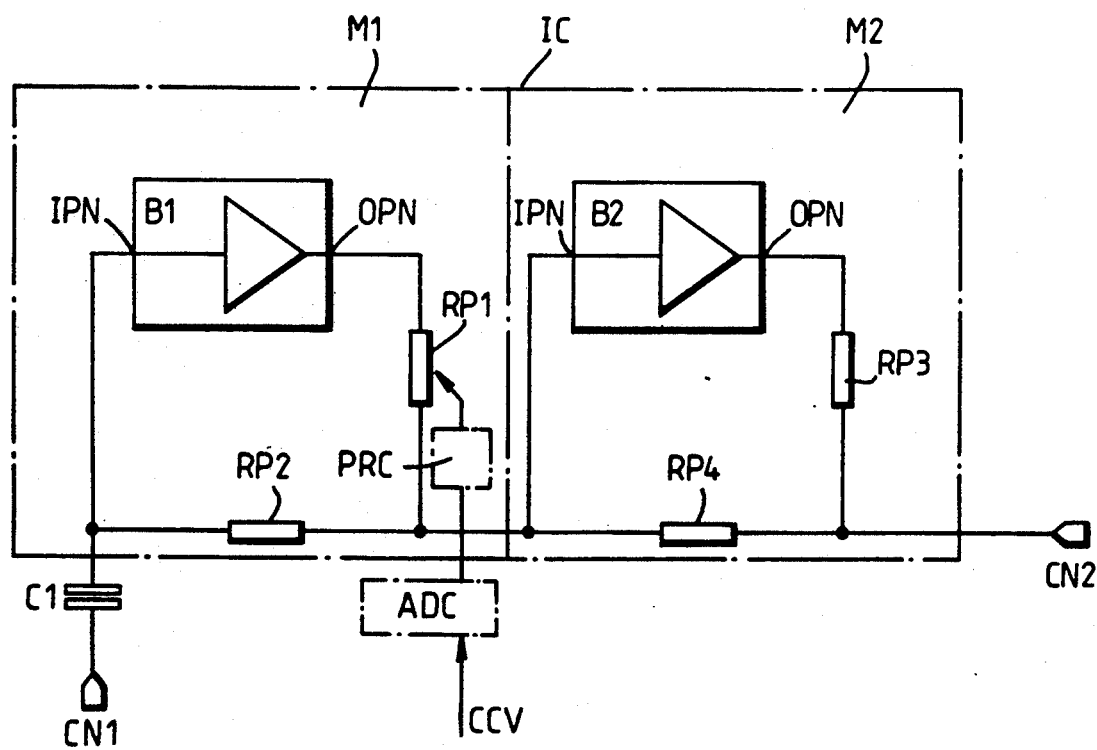
FIG. 24 show a schematic diagram of a capacitor multiplier circuit.

Referring to the drawings and particularly to FIG. 24 which illustrates a programmable capacitor circuit, it should be appreciated that capacitors are implemented using a capacitive multiplier technique. Programmable capacitors comprise essentially three elements, a capacitor C1 and one or two capacitor multipliers M1 and M2. These are shown connected between nodes CN1 and CN2.

As it is not possible to fabricate one hundred 5E−9 Farad capacitors, a small capacitor C1 (5E−12 Farad) is fabricated and the equivalent of the required capacitor value is then generated by a process of impedance conversion.

The 5E−12 Farad capacitor C1 is connected to the output of a first buffer circuit B1. Programmable resistors RP1 and RP2 (resistors whose values may be changed as required) are connected in series between the input and output of the first buffer circuit B1, an output being taken from the junction between the first and second programmable resistors. By this arrangement of components, the ratio of the set values of the two programmable resistors RP2 and RP1 determines the amount by which the capacitor (C1) value is multiplied.

The set value of resistor RP2 is higher than the set value of resistor RP1, therefore, the effect at the junction of resistors RP1 and RP2 is multiplication, and an overall effective capacitance value equal to $(RP2/RP1) \times C1$. The effective capacitance at the junction of resistors RP1 and RP2 is further multiplied by the second stage multiplier M2, including programmable resistors RP3 and RP4 and a buffer B2. Thus, the final effective capacitance at the junction of resistors RP3 and RP4 approximates to $(RP2/RP1) \times (RP4/RP3) \times C1$. This second stage multiplication is necessary if higher value capacitors are required in order to avoid the effects of parasitic capacitance present in the higher value programmable resistors required to produce a higher value capacitor.

Programmable resistors RP2 and RP4 are utilized for programming the final capacitance while resistor RP1 is driven by a reference signal CCV (see FIG. 24 and FIG. 25) to compensate for the manufacturing/processing variations of capacitor C1.

The main drawback of this type of circuit is that high Q capacitors cannot be produced. For most applications for capacitors produced in this manner, however, this is not a major problem since the capacitor multiplier has a series resistance that approximates to the value of resistor RP3.

Figure 25:
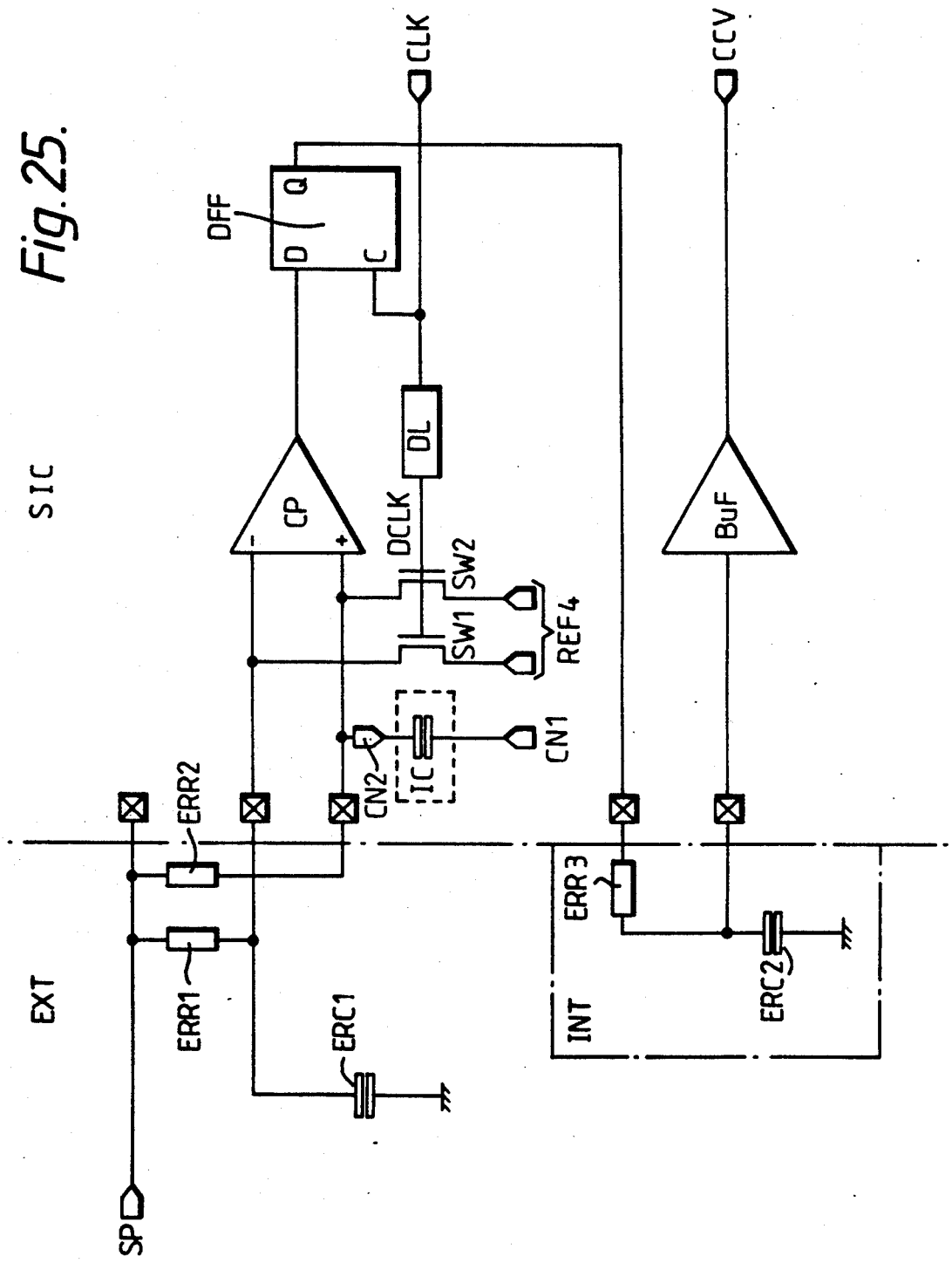
FIG. 25 shows a schematic diagram of a capacitor compensating circuit.

The capacitor compensating circuit shown in FIG. 25, including an external section EXT and a semiconductor integrating circuit section SIC, is arranged to provide a capacitor multiplier voltage reference control signal CCV which controls the programmable resistor RP1. In this way, the variations in oxide thickness of the $5E-12$ farad capacitor C1 are automatically compensated for.

A supply voltage is applied to terminal SP, and in operation it is arranged for a timing circuit to compare the time constants of two separate but substantially identical capacitor/resistor circuits. One time constant circuit employs an accurate external capacitor ERC1 of $5E-9$ farads in series with a known accurate value, external resistor ERR1 and the other time constant circuit employs an internal capacitor IC (of the type shown in FIG. 24) of $5E-9$ farad (generated by multiplication of an internal capacitor of $5E-12$ farads) in series with an external resistor ERR2.

It is arranged that the two capacitors IC and ERC1 are charged and discharged repeatedly by switching the switches SW1 and SW2 under control of clock signals DCLK which is the clock signal CLK delayed by the delay DL. The connectors REF4 on the switches SW1 and SW2 are conveniently connected to zero volts.

At the time of the delayed clock signals DCLK, the comparator CP repeatedly compares the voltages across each of the capacitors IC and ERC1 to determine which of the capacitors is charging up the fastest and the resultant output from the comparator is latched/stored by the 'D' type flip-flop DFF.

At the actual time of the clock signals CLK, the output Q from the flip-flop DFF (the previous signal comparison output corresponding to the time of the immediately preceding clock signal CLK) is output to an integrator circuit INT comprising a further external capacitor ERC2 and a further external resistor ERR3, and this integrates successive output signals from Q. The output from the integrator circuit IC is fed through a second buffer circuit BUF to provide a reference signal CCV (an analogue signal) which provides a direct control for varying the value of resistor RP1 in the multiplier M1, and thereby changing the ratio RP2/RP1 and hence the effective value of the capacitor IC.

It should be understood that the analogue signal CCV requires conversion to an equivalent digital form to be effective on the circuit to change the value of the resistor RP1. This may be achieved by a suitable analogue-to-digital converter ADC inserted between the output of the second buffer circuit BUF and the input to the circuit PRC for controlling the programmable resistor RP1.

Thus, in operation, an iterative process takes place whereby the integrator circuit continuously changes the analogue signal CCV which in turn changes the value of resistor RP1 and in turn the effective value of the internal capacitor IC. This process continues until the correct value of capacitance is attained.

Explaining this further, if the internal capacitor IC charges up quicker than the external capacitor ERC1, then the reference voltage CCV is reduced. This has the effect of increasing the value of the internal capacitor IC by varying the ratio of the resistors RP1 and RP2 in the multiplier M1.

Alternatively if the external capacitor ERC1 charges up quicker than the internal capacitor IC, then the reference voltage CCV is increased. This has the effect of decreasing the value of the internal capacitor IC by varying the ratio of the resistors RP1 and RP2 in the multiplier M1.

Figure 26:
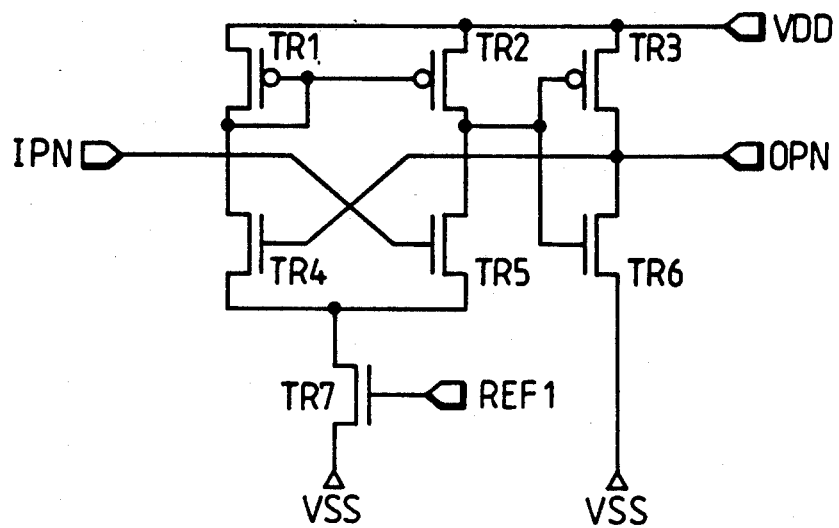
FIG. 26 shows a detailed circuit of an analogue buffer as used in the circuit of FIG. 24.

Referring now to FIG. 26 which shows a detailed circuit diagram of a high impedance input, low impedance output unity gain buffer stage as employed in the multipliers M1 and M2 for first buffer circuits B1 and B2, the input is designated IPN and the output is designated OPN. These nodes are designated identically in both FIG. 24 and FIG. 25.

The buffer circuit comprises three P-type MOS transistors. TR1, TR2 and TR3 and three N-type MOS transistors TR4, TR5, TR6 and TR7. VSS and VDD represent the supply voltage for the circuit while REF1 represents a suitable reference bias voltage.

Figure 29:
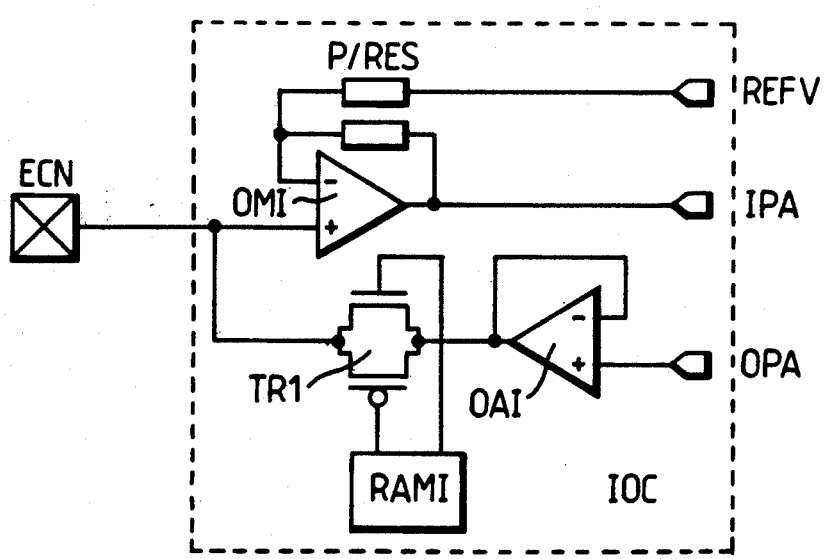
FIG. 29 shows a schematic diagram of a peripheral programmable gain input/output circuit.

FIG. 29 shows the details of the peripheral programmable gain input/output circuit IOC (FIG. 1). Each cell employs operational amplifiers OAI, a random access memory, RAM1 a programmable resistor P/RES and a transistor switch TR1 serving as a pass transistor. ECN represents the bond pad connection while IPA represents the input to the array whereas OPA represents the output from the array. REFV represents a reference voltage.

LOWPASS FILTER CIRCUIT EXAMPLE

Figure 30:
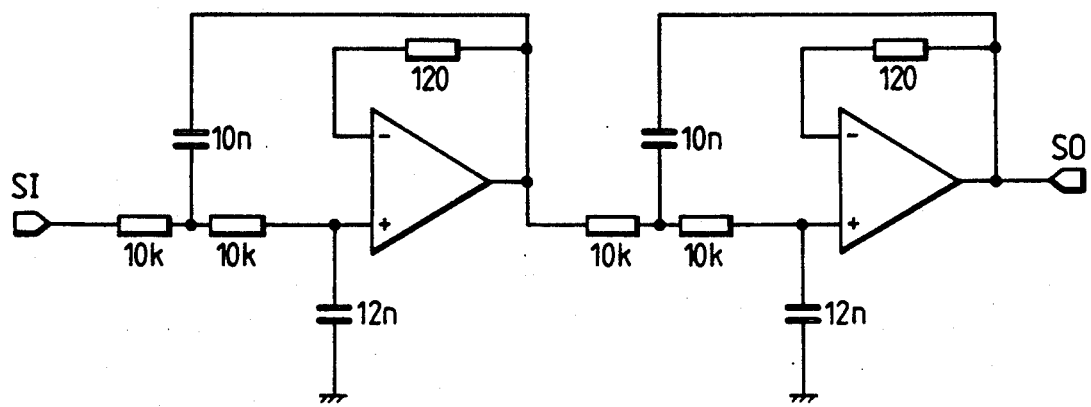
FIG. 30 shows a schematic diagram of a conventional form pole low pass filter.
Figure 31:
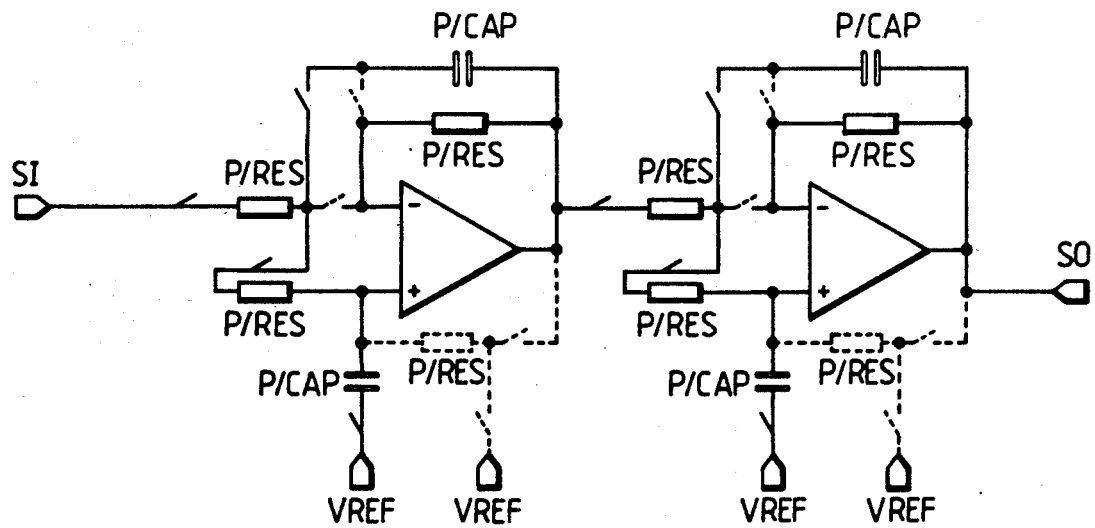
FIG. 31 shows the circuit of FIG. 30 implemented within the array.

A second order low pass filter is illustrated in FIG. 30. The same circuit implementation on the array is illustrated in FIG. 31. In FIG. 31, those components and portions of circuit not used, i.e. switched out, are shown in dotted outline.

What is claimed is:

1. A semiconductor integrated circuit for executing a plurality of different analogue functional applications, the circuit comprising:
   an array of analogue cells, each cell having internal circuitry with variable connections in said internal circuitry to permit internal configuration in a selected one of a plurality of different circuit functions;
   interconnection circuitry coupled to said array for enabling the interconnection of any cell in said array with any other one or more cells in said array; and
   selection and accessing circuitry coupled to said interconnection circuitry for selectively and individually selecting and accessing each cell in said array, and connecting a selected and accessed cell to a source of configuration data to internally configure the selected and accessed cell in one of said different circuit functions and for controlling said interconnection circuitry to affect selective interconnection of a selected and accessed cell with one or more other cells in said array to implement a particular analogue functional application from said plurality of different analogue functional applications.

2. A semiconductor integrated circuit as claimed in claim 1, wherein the array further comprises first data paths incorporating switch control paths, and the interconnection circuitry includes associated switch circuits, wherein cell configuration data stored in a storage means in digital form is directed to an individually accessed selected cell in digital form over a switch control path to affect operation of the associated switch circuits and interconnection of the selected analogue cell with other analogue cells of the array.

3. A semiconductor integrated circuit as claimed in claim 2, wherein the switch circuits each include a storage means to store configuration data and a transistor switch serving as an interconnecting device.

4. A semiconductor integrated circuit as claimed in claim 3, wherein the interconnection circuitry comprises a global interconnect system and a local interconnect system wherein the global interconnect system is employed to interconnect any cell to any other cell which is located at a distance within the array and the local interconnect system is employed to interconnect the output of each cell to the inputs of neighboring cells.

5. A semiconductor integrated circuit as claimed in claim 4, wherein an analogue cell comprises, an amplifier, programmable analogue components, switching means and signal paths, and wherein to implement any predetermined analogue circuit, the analogue components are programmed for required intrinsic values and the switching means are utilized to interconnect the programmed components and signal paths in a particular predetermined configuration.

6. A semiconductor integrated circuit as claimed in claim 5, wherein intrinsic component values are stored in digital form.

7. A semiconductor integrated circuit as claimed in claim 5, wherein the array includes selection signal paths adapted for selecting individual analogue cells wherein cell selection signals emanate from signal generating means under the control of a central control means and are successively directed to the selection signal paths associated with individual analogue cells.

8. A semiconductor integrated circuit as claimed in claim 7, wherein the array includes second data paths for providing analogue data to each analogue cell the analogue data having been converted from digital cell configuration data by digital-to-analogue conversion means, wherein the analogue data is directed over the second data paths to the selected cell.

9. A semiconductor integrated circuit as claimed in claim 8 wherein the analogue data comprises a plurality of separate analogue signals each of which represents a particular value of a component which is to be programmed in the analogue cell.

10. A semiconductor integrated circuit as claimed in claim 1, wherein the cells of the array of configurable analogue cells are arranged in rows and columns.

11. A semiconductor integrated circuit as claimed in claim 10, wherein the signal generating means comprises a first programming shift register and a second programming shift register, wherein the first programming shift register provides horizontal coordinate reference signals within the array, whereas the second programming shift register provides vertical coordinate reference signals within the array, the horizontal and vertical coordinate reference signals enabling selection of any analogue cell within the array.

12. A semiconductor integrated circuit as claimed in claim 11, wherein the global interconnect system includes horizontal global bus lines running horizontally between the rows of analogue cells and vertical global bus lines running vertically between the columns of analogue cells.

13. A semiconductor integrated circuit as claimed in claim 12, wherein at all edges of the array there are provided switch blocks which enable the vertical and horizontal global bus lines at the edges of the array to be directly interconnected.

14. A semiconductor integrated circuit as claimed in claim 10, wherein the semiconductor integrated circuit is adapted to produce a programmable resistor component which comprises a pair of matched characteristic field-effect transistors having gate, source and drain electrodes, wherein the first transistor of the pair serves as a reference transistor and the second transistor of the pair serves to provide the actual resistor value.

15. A semiconductor integrated circuit as claimed in claim 14, wherein the semiconductor circuit further comprises, a differential amplifier, an adjustable constant current source, and first and second reference potentials, and wherein the constant current source serves as a load for the reference transistor said reference transistor being connected to provide a negative feedback path to the differential amplifier whereby the operation of the differential amplifier is arranged to adjust the gate electrode voltage of said reference transistor until a specific voltage drop relative to the first and second reference potentials appear across said reference transistor to thereby establish a predetermined resistance between the source and drain electrodes of said reference transistor and whereby the gate electrode voltage of said reference transistor is arranged to directly control the conductance of the second transistor of said matched characteristic field-effect transistors to set the required resistor value.

16. A semiconductor integrated circuit as claimed in claim 15, wherein the semiconductor integrated circuit is adapted to produce a linear resistor by the provision of a complementary pair of matched characteristic field-effect transistors of opposite polarity types whereby the second transistors of each pair of matched characteristic field-effect transistors are connected in parallel and whereby in operation of said second transistors a linear transfer characteristic function is achieved.

17. A semiconductor integrated circuit as claimed in claim 16, wherein each programmable resistor comprises a resistor network including a plurality of pairs of opposite polarity field-effect transistors being arranged to be capable of producing different ranges of resistor values, wherein a particular range is selected by cell configuration data extending over a data bus to a memory means whose output is adapted to switch the selected range of resistors into operation.

18. A semiconductor integrated circuit as claimed in claim 15, wherein the adjustable constant current source is adjusted by means of the analogue signals.

19. A semiconductor integrated circuit as claimed in claim 1, wherein the integrated circuit includes programmable capacitor components which include at least one capacitor multiplier circuit.

20. A semiconductor integrated circuit as claimed in claim 19, wherein each opposite polarity field-effect transistor has an associated capacitive analogue storage circuit capable of storing and retaining an analogue potential on the gate electrode of said reference transistor when said specific voltage drop is attained.

21. A semiconductor integrated circuit as claimed in claim 1, wherein manufacturing component tolerances for all analogue components are automatically compensated for by a single external resistor and a single external capacitor.

* * * * *